United States Patent

Shiotsuka et al.

[11] Patent Number: 5,973,258
[45] Date of Patent: Oct. 26, 1999

[54] PHOTOVOLTAIC DEVICE

[75] Inventors: Hidenori Shiotsuka, Nara; Takahiro Mori, Ikoma; Ichiro Kataoka; Satoru Yamada, both of Kyotanabe; Ayako Komori, Joyo, all of Japan

[73] Assignee: Canon Kabushiki Kaisha, Tokyo, Japan

[21] Appl. No.: 09/007,184

[22] Filed: Jan. 15, 1998

[30] Foreign Application Priority Data

Jan. 21, 1997 [JP] Japan .................................... 9-008288

[51] Int. Cl.$^6$ ............................................. H01L 31/00
[52] U.S. Cl. .......................... 136/252; 136/251; 438/64
[58] Field of Search .................... 136/252, 251; 438/64

[56] References Cited

U.S. PATENT DOCUMENTS

| | | | |
|---|---|---|---|
| 5,527,717 | 6/1996 | Inoue | 437/4 |
| 5,578,141 | 11/1996 | Mori | 136/251 |
| 5,660,646 | 8/1997 | Kataoka | 136/251 |
| 5,684,325 | 11/1997 | Kataoka | 257/433 |
| 5,718,772 | 2/1998 | Mori | 136/251 |

FOREIGN PATENT DOCUMENTS

| | | |
|---|---|---|
| 0 658 943 | 6/1995 | European Pat. Off. . |
| 0 681 335 | 11/1995 | European Pat. Off. . |
| 0 751 575 | 1/1997 | European Pat. Off. . |
| 0 784 348 | 7/1997 | European Pat. Off. . |

OTHER PUBLICATIONS

Patent Abstracts of Japan, vol. 010, No. 192 (E–417), Jul. 5, 1986 (JP 61–035572).
Patent Abstracts of Japan, vol. 018, No. 545 (E–1617), Oct. 18, 1994 (JP 06–196741).

*Primary Examiner*—Mark Chapman
*Attorney, Agent, or Firm*—Fitzpatrick, Cella, Harper & Scinto

[57] ABSTRACT

The present invention provides a solar cell module comprising a photovoltaic device and a production method thereof. Since photovoltaic device has high electrostatic withstand voltage and high reliability, a high yield is obtained in a production process before a step of sealing the photovoltaic device in a resin. The solar cell module of the present invention is a solar cell module produced by sealing with a resin a photovoltaic device having at least one layer of a semiconductor photoactive layer as a light converting member, and collector electrodes formed on a light-receiving surface side of the semiconductor photoactive layer, wherein the photovoltaic device before the resin sealing has the electrostatic withstand voltage of not less than 5 kV. The production method of solar cell module comprises sealing with a resin the photovoltaic device provided with the thin-film resin layer, wherein the photovoltaic device is placed on a support substrate with the light-receiving surface side facing up, thereafter a filler and a fluorine film are successively stacked on the light-receiving surface side of the photovoltaic device, and the resin sealing is effected by heating in vacuum.

11 Claims, 7 Drawing Sheets

PHOTOVOLTAIC DEVICE

BACKGROUND OF THE INVENTION

1. Field of the Invention

The present invention relates to a photovoltaic device that can be protected from electrostatic voltage even when touched by a charged worker.

2. Related Background Art

In recent years, increase in awareness of environmental problems has been spreading on a worldwide scale. Among others, concern is deep over the global warming phenomenon due to emission of $CO_2$, and desires for clean energy source have becoming stronger and stronger. At present, solar cells can be considered to be one of hopes as a clean energy source because of their safety and easiness to handle.

There are a variety of solar cells, for example, typified by crystal silicon solar cells, polycrystal silicon solar cells, amorphous silicon solar cells, copper indium selenide solar cells, compound semiconductor solar cells, and so on. Among them, the thin-film crystal silicon solar cells, compound semiconductor solar cells, and amorphous silicon solar cells are recently under active research and development in various fields, because they can be formed in a large area at relatively low cost.

The cost of the solar cells now available is, however, still high, and it is thus necessary to further decrease the cost thereof. For that purpose, problems to be solved are, for example, as follows.

(i) Efficient utilization of electric power-generating region (ii) Reductions in costs for connecting members at connecting portions and labor costs for connection In order to improve above (i), it is necessary to increase the percentage of the electric power-generating region with regard to the area where the solar cell is installed. In order to improve above (ii), it is necessary to increase the area of solar cell.

FIGS. 8A and 8B are schematic views to show a conventional photovoltaic device improved in above (i) and (ii).

In FIGS. 8A and 8B, reference numeral 800 designates a photovoltaic device, 801 a flexible substrate, 802 a semiconductor layer, 803 a transparent electrode layer, 804 a positive electrode busbar, 805 collector electrodes, 806 negative electrode busbars, 807 an insulating tape and 808 solder. One end of the positive electrode busbar 804 of one photovoltaic device is soldered to a portion of the negative electrode busbar 806 of another adjacent photovoltaic device, thereby connecting these two photovoltaic devices. This connection is repeated with a plurality of photovoltaic devices to obtain a solar cell module.

The photovoltaic devices described above, however, has a low electrostatic withstand voltage and therefore causes the following problems. Here, the electrostatic withstand voltage in the present invention means a value of applied voltage that causes 10% decrease of Voc under 200 Lux between before and after application thereof when an arbitrary voltage is applied to the electric power-generating region of light-receiving surface.

(1) The electrode busbars-leading structure as shown in FIGS. 8A and 8B can decrease the non-electric power-generating region on the light-receiving surface side as compared with a case of leading both of the positive and negative electrode busbars on the light-receiving surface side. However, in order to minimize the effect of a flux used in soldering on the light-receiving surface of photovoltaic device in a series connection step, the series connection needs to be conducted while keeping the light-receiving surface side of photovoltaic device facing down. On that occasion, a tool used for the series connection might rub the light-receiving surface of photovoltaic device to generate the static electricity. When the charged tool or worker touches the photovoltaic device, the electricity will be discharged to the photovoltaic device in some cases. This sometimes resulted in damaging the semiconductor layer of photovoltaic device.

(2) For sealing the photovoltaic device with a resin, filler films or glass fibers are stacked on the light-receiving surface side, and thereafter the filler film is shifted for adjustment of alignment or the stacking is done over again, whereupon the static electricity will be generated. This sometimes resulted in damaging the semiconductor layer of photovoltaic device and thus failing to achieve sufficient electrical characteristics. It is the present status that countermeasures against the static electricity rely on facilities such as a wrist band, a table mat, a floor mat, or installation of the earth for prevention of charging, but they are far from sufficient.

(3) The photovoltaic devices are sometimes packed and conveyed before the sealing thereof with the resin. On that occasion, a spacer of slipsheet or foam is interposed between photovoltaic devices. When the photovoltaic devices are moved or taken out, friction generates the static electricity. The use of spacer of slipsheet or foam for prevention of charging was the cause of increase of cost as a result of the fact that reuse thereof was difficult.

SUMMARY OF THE INVENTION

An object of the present invention is to provide a photovoltaic device with high electrostatic withstand voltage and with high reliability and a production method thereof capable of achieving a high yield in a production process before a step of sealing the photovoltaic device with the resin.

The inventors conducted extensive and intensive research and development for solving the above problems and found that the following structure was best.

(1) A solar cell module of the present invention is a solar cell module obtained by carrying out resin sealing (hereinafter, simply referred to as "lamination") such as sealing with a resin sheet or the like a photovoltaic device comprising at least one semiconductor photoactive layer as a photoelectric converting member and a collector electrode formed on the light-receiving surface side of the aforementioned semiconductor photoactive layer, wherein the photovoltaic device before the lamination has an electrostatic withstand voltage of not less than 5 kV.

Since the photovoltaic device before the lamination has the electrostatic withstand voltage of not less than 5 kV, the semiconductor layer of the photovoltaic device can be prevented from being damaged even when a charged worker or a manufacturing or measuring instrument touches the semiconductor layer to induce discharge. As a result, the yield is increased in the production steps of photovoltaic device.

In the resin-sealing (or lamination) step, the photovoltaic device can also be protected from the static electricity generated when a filler film or/and a nonwoven fabric of glass fibers are shifted on the photovoltaic device or when the stacking thereof is done over again, in order to achieve alignment between the photovoltaic device and the resin.

(2) Since a thin-film resin layer is provided on at least the electric power-generating region of the light-receiving surface side of the photovoltaic device, the photovoltaic device can have the electrostatic withstand voltage of not less than 5 kV. During the work for connecting the photovoltaic devices in series or in parallel, the photovoltaic devices can be protected from mechanical or thermal impact such as drop of tweezers onto the photovoltaic device or contact with solder, which is normally considered to induce deterioration of the device.

(3) At least two photovoltaic devices described above are connected in series or in parallel, whereby the lamination can be done after formation of a large-area photovoltaic device array. This can avoid such poor workability that the lamination is repeated plural times for photovoltaic devices of small area. It can also decrease the percentage of the non-electric power-generating region with regard to the installation area.

(4) The thin-film resin layer is formed by a film coat method, whereby the thin-film resin layer can be selectively formed on a part of the light-receiving surface side of photovoltaic device.

(5) The production method of a solar cell module according to the present invention is a method for producing a solar cell module in which the photovoltaic device provided with the thin-film resin layer is sealed with a resin, the production method comprising the steps of: placing the photovoltaic device on a support substrate such that the light-receiving surface side of the photovoltaic device faces up, thereafter successively stacking a filler and a fluoroplastic film on the light-receiving surface side of the photovoltaic device, and performing heating in vacuum to effect resin sealing.

As a result, an amount of the resin necessary for filling unevenness on the photovoltaic device can be decreased. Namely, the production method of solar cell module excellent in flame resistance can be obtained by decreasing the amount of highly combustible resin.

Since the amount of resin used can be decreased, the cost can also be reduced.

DESCRIPTION OF THE PREFERRED EMBODIMENTS

Figure 1:
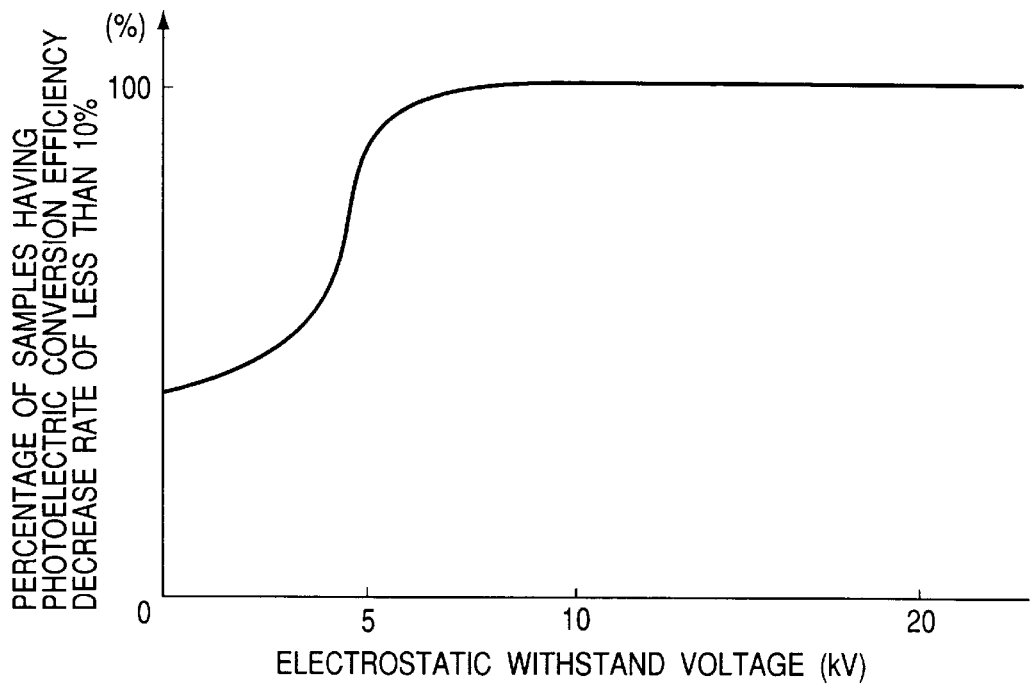
FIG. 1 is a graph to show the relationship between the electrostatic withstand voltage of photovoltaic devices as samples and the percentage of samples having the photoelectric conversion efficiency decrease rate of less than 10%.

Embodiments of the present invention will be described.
(Photovoltaic device)

The photovoltaic device according to the present invention is preferably provided with a first electrode, a semiconductor layer provided on the first electrode and contributing to electric power generation, and a second electrode as a collector electrode provided on the light incidence surface side of the semiconductor layer. A transparent, electroconductive layer may also be provided between the light incidence surface side of the semiconductor layer and the collector electrode, if desired, for the purpose of preventing reflection and for the purpose of decreasing the surface resistance. The first electrode of the photovoltaic device of the present invention is provided on the back surface side of the semiconductor layer and is made of a metal by a method such as a screen printing method or a vapor deposition method. Any kind of metals is properly selected which have a good ohmic property with the semiconductor.

When the semiconductor layer is a thin film of amorphous silicon, a flexible substrate is necessary. An insulating or electroconductive substrate is used as the flexible substrate. When the flexible substrate is an insulating substrate, the first electrode is deposited on the substrate.

A metal substrate such as stainless steel or aluminum is suitably applicable and serves as both the first electrode and the flexible substrate, but the first electrode may be a metal such as chromium, aluminum, or silver vapor-deposited on an insulating substrate such as glass, polymer resin, or ceramic. In the case of the crystal silicon solar cell, the first electrode may be formed on crystal silicon by screen printing of silver paste or the like without using a substrate.

The semiconductor layer needs to have the structure including a semiconductor junction such as a pn junction, a pin junction, or a Schottky junction, and a material thereof is suitably selected from IV-semiconductors containing an element of Group IV of the Priodic Table in crystal silicon, polycrystal silicon, thin-film polycrystal silicon, amorphous silicon or the like, II–VI semiconductors containing elements of Groups II and VI of the Priodic Table such as CdS or CdTe, and III–V semiconductors containing elements of Groups III and V of the Priodic Table such as GaAs. For the semiconductor layer, a tandem cell and a triple cell with a plurality of pin junctions or pn junctions are also suitably applicable without having to be limited to a single cell. Specific examples of the tandem cell structure are a structure in which the top layer and the bottom layer are stacked each having pin junction comprising an i-type layer of amorphous silicon (hereinafter referred to as "a-Si") and another structure in which the top layer of pin junction comprising an i-type layer of a-Si and the bottom layer of pin junction comprising an i-type layer of amorhous SiGe (hereinafter referred to as "a-SiGe") are stacked. These examples also include a structure in which the top layer has a pin junction comprising the i-type layer of a-Si and the bottom layer has a pn junction of thin-film polycrystal. Specific examples of the triple cell structure are a structure in which the top layer and the middle layer each having pin junction comprising the i-type layer of a-Si and the bottom layer having pin junction comprising the i-type layer of a-SiGe are stacked, and a structure in which the top layer having pin junction comprising the i-type layer of a-Si, the middle layer having pin junction comprising the i-type layer of a-SiGe, and the bottom layer having pin junction comprising the i-type layer of a-SiGe are stacked.

A material for the transparent, electroconductive layer is suitably selected from the well-known materials such as ITO, $SnO_2$, or $In_2O_3$.

Figure 5A:
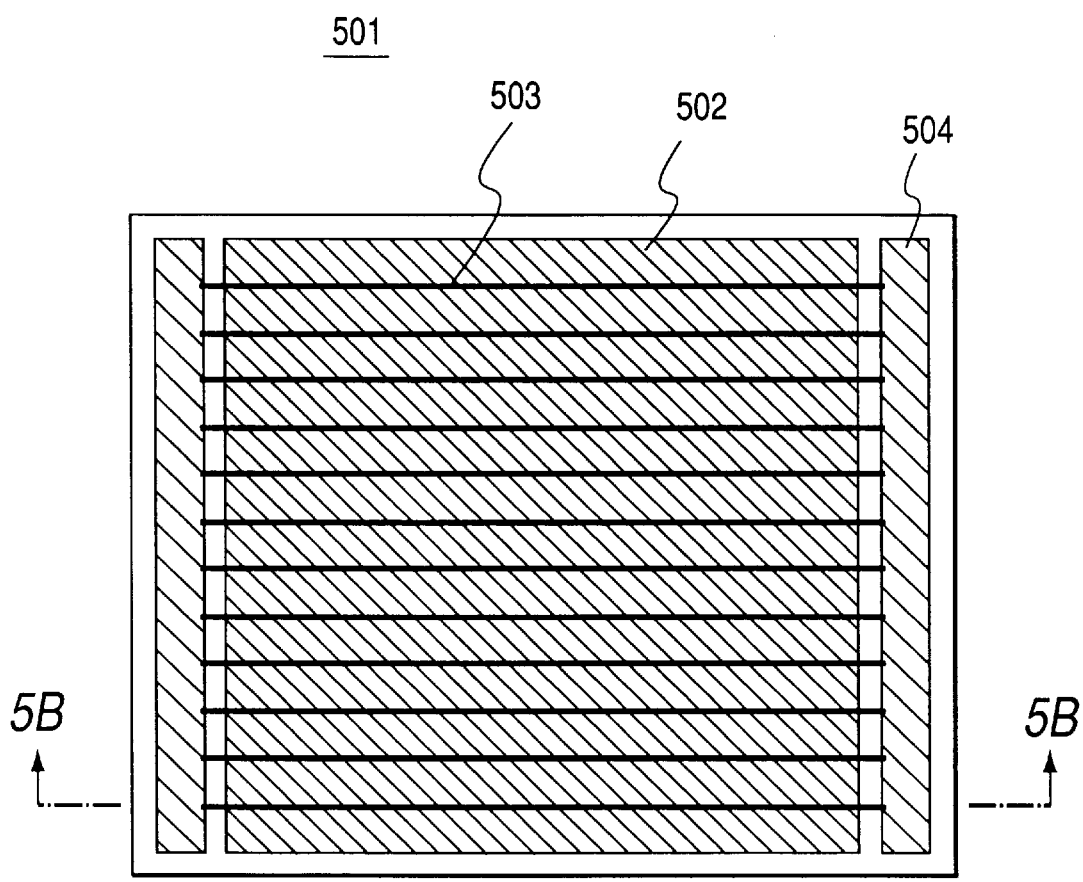
FIGS. 5A and 5B are schematic plan view and cross-sectional view to show the structure of a photovoltaic device used in the solar cell module according to the present invention.
Figure 5B:
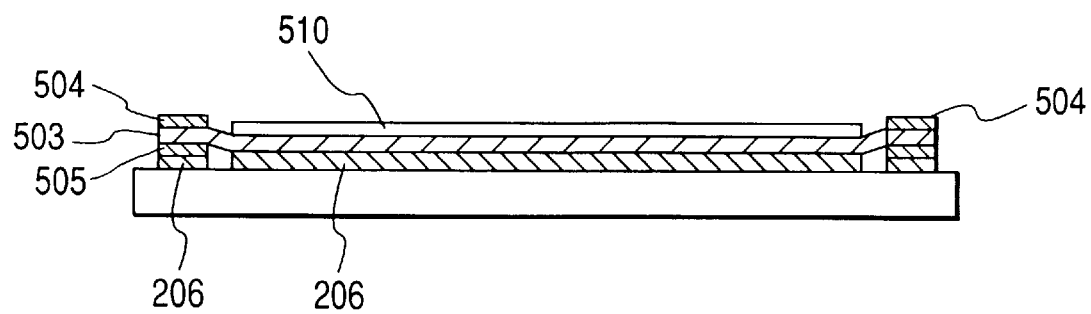

As shown in FIGS. 5A and 5B, the collector electrode is placed on the transparent electrode layer 206, and the ends of the collector electrodes are placed through the insulating member 505. The placing method is preferably carried out such that the collector electrodes are placed in parallel at appropriate intervals so as to minimize the sum of shadow loss and loss due to electric resistance in collection of electricity. For example, if the sheet resistance of the transparent electrode layer is approximately 100 $\Omega/mm^2$, the intervals of the collector electrodes will be preferably approximately 5 mm. If the collector electrodes are wires of a small diameter, the pitch will be set narrow; if they are wires of a large diameter, the pitch will be set wide. Such optimization can achieve the highest efficiency.

Figure 2A:
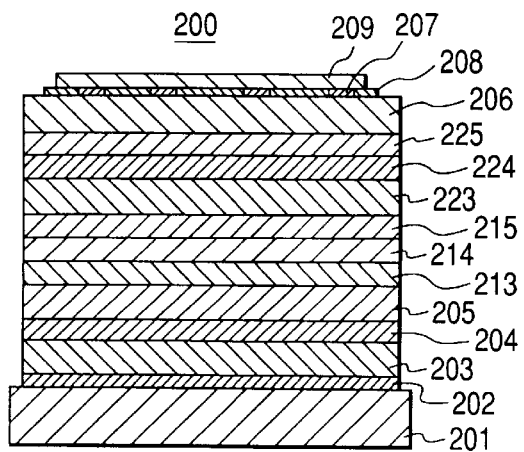
FIGS. 2A and 2B are schematic cross-sectional views to show the structure of a photovoltaic device used in the solar cell module according to the present invention.
Figure 2B:
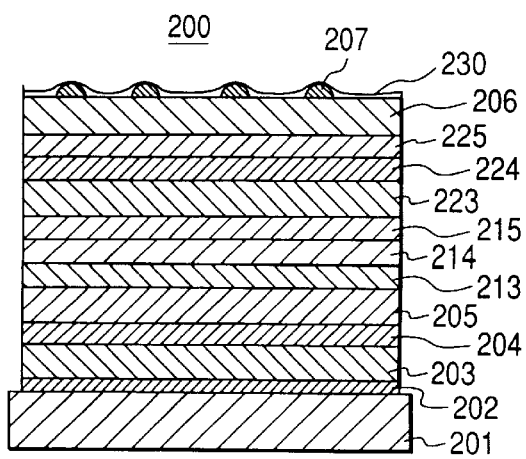

FIGS. 2A and 2B are schematic cross-sectional views to show an example of a triple cell type amorphous photovoltaic device of the present invention. In FIGS. 2A and 2B, reference numeral 200 designates a photovoltaic device, 201 a flexible substrate, 202 a first electrode, 203, 213 and 223 n-type semiconductor layers, 204, 214 and 224 i-type semiconductor layers, 205, 215 and 225 p-type semiconductor layers, 206 a transparent, electroconductive layer, 207 collector electrodes, 208 an adhesive, and 209 a positive electrode busbar. FIG. 2A is a cross-sectional view of a busbar-formed portion of this structure, and FIG. 2B is a cross-sectional view of a portion where the aforementioned collector electrodes are formed on the surface of photovoltaic device in the electric power-generating region. The surface of photovoltaic device in the power-generating region is covered by thin-film resin layer 230 of the present invention. FIGS. 2A and 2B showed the triple cell structure, but it is needless to mention that the single cell having one semiconductor junction and the tandem cell having two semiconductor junctions are also included in the structures of the present invention.

(Production method of photovoltaic device)

In the production method of the photovoltaic device according to the present invention, the collector electrodes are preferably bonded onto the semiconductor layer or the transparent, electroconductive layer on the light incidence side by a bonding method with heat or pressure or with heat and pressure. The heating temperature is preferably set to be equal to or higher than the temperature at which the coating layer of a electroconductive resin softens and adheres to the surface of the photovoltaic device. The pressure is preferably set to be the pressure to induce moderate deformation of the coating layer, but must be smaller than the pressure that is too low to damage the photovoltaic device. Specifically, for example, in the case of the thin-film photovoltaic device, for example, of amorphous silicon, the preferred pressure is 0.1 $kg/cm^2$ to 1.0 $kg/cm^2$. The bonding method may be a method for applying the adhesive onto parts or the whole of wires to conduct bonding, or a method for forming patterns of the adhesive in a linear shape or in a desired shape of dot on the surface of photovoltaic device by screen printing or the like and then placing the wires to conduct bonding. When the coating layer is of the hot melt type, it should be desirably softened by heat to bond the wires to the solar cell, and an appropriate pressure may also be applied upon bonding. When the coating layer is thermoplastic, it is softened by heating; when it is a thermosetting resin, it is also permitted performing only drying of solvent without curing of the resin upon the application to the wires or upon the printing on the solar cell substrate and then curing the resin by heating upon bonding.

Figure 3A:
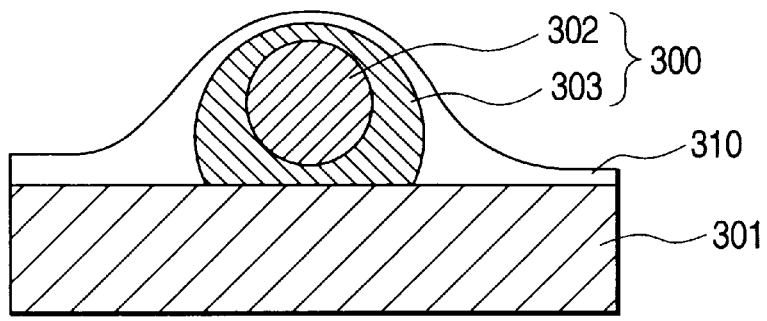
FIGS. 3A and 3B are schematic cross-sectional views to show a contact portion between a collector electrode and the surface of the photovoltaic device according to the present invention.
Figure 3B:
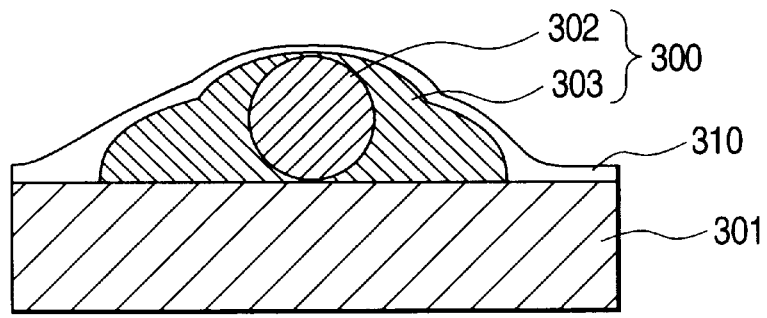

FIGS. 3A and 3B are schematic cross-sectional views to show a state in which a metal wire is bonded to the surface of photovoltaic device. In FIGS. 3A and 3B, numeral 300 denotes a collector electrode, 301 a photovoltaic device, 302 a metal wire, and 303 a electroconductive adhesive. Numeral 310 designates a thin-film resin layer according to the present invention. FIG. 3A is a cross-sectional view to show a state in which the metal wire coated with the electroconductive adhesive is bonded to the surface of photovoltaic device. FIG. 3B is a cross-sectional view to show a state in which the metal wire is placed and the conductive adhesive is partly placed to bond the wire to the surface of the photovoltaic device.

(Thin-film resin layer)

The thin-film resin layer 230 according to the present invention is provided at least on the electric power-generating region on the light-receiving surface side of the photovoltaic device and has a function to protect the photovoltaic device from the static electricity due to the charge on the worker or neighboring equipment. The thin-film resin layer permits the photovoltaic device to have the electrostatic withstand voltage of not less than 5 kV and it can protect the photovoltaic device in the normal lamination work. The inventors found that, conversely, when the electrostatic withstand voltage was less than 5 kV, the photoelectric conversion efficiency was greatly lowered after the lamination work.

The electrostatic withstand voltage of photovoltaic device depends upon the thickness of the thin-film resin layer. The average thickness thereof is desirably not less than 5 $\mu$m. As shown in FIGS. 3A and 3B, the resin of thin-film resin layer 310 is likely to cohere near the electrode 300. On the other hand, the thin-film resin layer 310 is very thin or the resin is absent, at the top of electrode 300. However, when the average thickness is not less than 5 $\mu$m, the electrostatic withstand voltage of photovoltaic device can be kept not less than 5 kV, which was found by the inventors. This is probably because the electrode 300 is a good conductor and does not affect the semiconductor layer therebelow even if the thin-film resin layer is very thin. Therefore, according to the present invention, the thin-film resin layer does not have to be thicker than necessary in order to cover the top part of the collector electrode. Too large thicknesses will lower the adhesion with a transparent, organic polymer resin described hereinafter. In addition, the thin-film resin layer is required to have high moisture resistance and low moisture permeability in order to prevent water from intruding through the surface of solar cell module, and to be transparent. The moisture permeability is desired to be preferably 0.01 to 20 $g/m^2$•day at 40° C. and 90% RH. If the moisture permeability is lower than 0.01 $g/m^2$•day, crystallinity will be too high to provide the solar cell module produced with flexibility. If the moisture permeability is higher than 20 $g/m^2$•day, the effect as an antimoisture film will not be expected at all. In order to restrain decrease in quantity of light reaching the photovoltaic device as much as possible, the light transmittance of the thin-film resin layer is desirably not less than 80%, more desirably not less than 90% in the visible light wavelength region of 400 nm to 800 nm. In order to facilitate incidence of light from the atmosphere, the index of refraction is preferably 1.1 to 2.0, more preferably 1.2 to 1.6.

Specific materials for the thin-film resin are resins the main component of which is an acrylic resin, a silicone resin, or a fluororesin.

As different curing type ones, a two-part type paint such as the moisture curing type or the isocyanate-curing type and a one-part type paint using blocking isocyanate. When the two-part type paint is used, the resin and a curing agent must be mixed immediately before application. The apparatus becomes complex and the collected resin which has been used cannot be reused, thus posing the problem of high cost. Therefore, a preferred material is a one-part type paint made of a resin obtained by heat-crosslinking an acrylic resin and an inorganic polymer with blocking isocyanate.

The dissociation temperature of blocking isocyanate as the block agent for crosslinking the acrylic resin and the inorganic polymer is preferably in the range of 80° C. to 220° C. If it is below 80° C., the pot life of the resin itself will shorten to thereby degrade storage performance; if it is over 220° C., the component such as the acrylic resin will thermally deteriorate or yellow and the heat given upon curing will possibly adversely affect the semiconductor layer. Since at least a part of the block agent remains in the paint film after thermal dissociation, it should be selected from those not coloring and not reacting with the coating composition even if it remains in the paint film. For provision of the adhesive property, a silane type, titanium type, or aluminum type coupling agent may be added by 0.01% to 10% to the resin. Preferably, the silane type coupling agent is added by 0.05 to 8%.

Specific paint film (i.e., thin-film resin layer) forming methods are methods for applying the paint onto the photovoltaic device by, for example, spray coater, spin coater, curtain coating, or film coating. The film coating method is preferred. Typically, after the drying of solvent, the paint film is heated at 200° C. for 10 minutes to harden.

(Film coating)

The above film coating in the present invention is a method for delivering the paint in a film shape from a gun while sending air to the gun such that the paint is discharged in a film shape. This method allows partial coating to an object to be coated by adjusting the width of the film. During the coating, the object can be moved while fixing the gun; or the gun can be moved while fixing the object. A plurality of guns may be used in parallel for coating the paint in a large area.

(Solar cell module)

Figure 4:
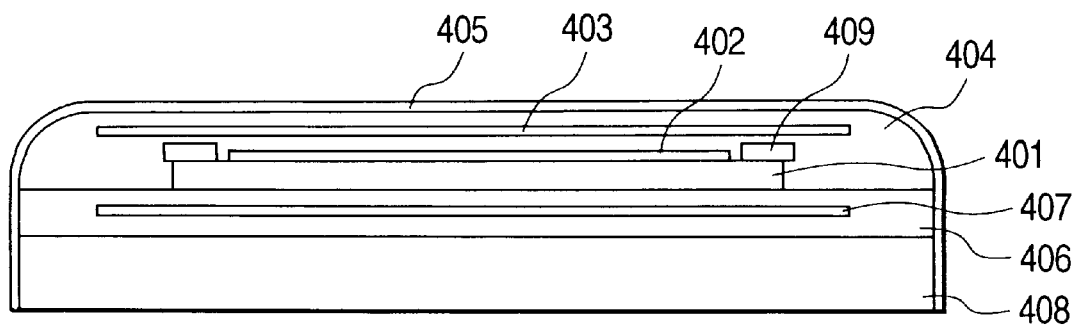
FIG. 4 is a schematic cross-sectional view to show the structure of a solar cell module according to the present invention.

The structure of the covering members used for covering the photovoltaic device according to the present invention will be described in detail. A solar cell module of the present invention is composed, as shown in FIG. 4, of photovoltaic device 401, thin-film resin layer 402, surface protecting and reinforcing material 403, surface sealing material 404, surface member 405, back sealing material 406, back insulating material 407, and back member 408. In order to cover the busbars 209 of photovoltaic device shown in FIG. 2A, decorative tape 409 is laid thereon.

The coating members located on the upper (or front) surface side of photovoltaic device 401 will be described below in detail.

(Decorative tape)

The decorative tape 409 is provided on the positive electrode busbars 504. In addition, it is also provided on the solder for connecting these photovoltaic devices in series. These positive electrode busbars are convex on the substrate. Therefore, the thickness of the covering member is thin on the positive electrode busbars and it is thus very weak against external impact. If the metal member of the busbar contacts the organic polymer resin and if it is further exposed to light, deterioration of the resin on the metal member will be accelerated or decomposition products of the resin will corrode the metal member. For improving these problems, a hard film of polyethylene terephthalate, nylon, polycarbonate, or the like is used as the decorative tape. Further, in order to interrupt the light, a film desired to use is a black or dark-brown film, specifically, a film having the overall ray transmittance of not more than 5% in the wavelength range of 300 nm to 800 nm. An organic polymer resin layer of EVA, EEA, or the like is desired to be provided under the film in order to cover the metal member under the film.

(Surface protecting and reinforcing material 403)

The surface protecting and reinforcing material 403 is desirably smaller than the back member 408 so as not to exist at the edges of solar cell module. If the surface protecting and reinforcing material 403 is equal to or larger than the back member 408 to be extended to the edges of module, water would intrude thereinto from the outside to promote deterioration of this covering material and to cause exfoliation. The intrusion of water would degrade the electrical insulation of the photovoltaic device inside from the outside. This is because the adhesive force is weak between the surface protecting and reinforcing material 403 and the surface sealing material 404 and therefore water intrudes along the surface of the surface protecting and reinforcing material 403 through the interface between them as the flow path. The adhesive force between the surface protecting and reinforcing material 403 and the surface sealing material 404 is drastically enhanced by subjecting either one of them or the both to a surface treatment such as a silane coupling treatment. There is, however, the limit of the level of enhancement, and the coupling agent will deteriorate after long-term outdoor exposure or after temperature-humidity cycle test, thereby degrading the adhesive force.

The surface protecting and reinforcing material 403 used in the present invention is necessary for achieving flame resistance while assuring scratch resistance with a decreased amount of a filler. Further, in the case of a large solar cell module of the roof or wall installation type, it is very effective for sufficiently degassing the inside of module upon the lamination. The nonwoven fabric of glass fiber is normally used as the surface protecting and reinforcing material used herein.

Further, the surface of the surface protecting and reinforcing material is desirably processed by the silane coupling treatment in order to enhance the adhesion between the surface protecting and reinforcing material 403 and the surface sealing material 404.

(Surface sealing material)

The surface sealing material 404 is necessary for coating the unevenness of photovoltaic device 401 with the resin, protecting the device from the severe external environments including the temperature change, humidity, and impact, and assuring bonding between the surface film and the device. Therefore, demanded are weather resistance, adhesiveness, filling ability, heat resistance, cold resistance, and impact resistance. Examples of resins satisfying these demands include polyolefin-based resins such as ethylene-vinyl acetate copolymer (EVA), ethylene-methyl acrylate copolymer (EMA), ethylene-ethyl acrylate copolymer (EEA) and polyvinyl butyral, and urethane resins, silicone resins, fluororesins, and so on. Among them, EVA is often used by choice, because it has well-balanced physical properties for applications to solar cells.

However, since it has a low heat distortion temperature in the original form and readily exhibits distortion or creep under use at high temperatures. Therefore, it is desirably crosslinked to enhance heat resistance. EVA is normally crosslinked with an organic peroxide. The crosslinking with the organic peroxide takes place in such a way that free radicals produced from the organic peroxide withdraw hydrogen or halogen atoms from the resin to form C—C bonds. The conventional methods for activating the organic peroxide are thermal decomposition, redox decomposition, and ion decomposition. In general, thermal decomposition is often used by choice. Specific examples of the organic peroxide are hydroperoxide, dialkyl (allyl) peroxide, diacyl peroxide, peroxy ketal, peroxy ester, peroxy carbonate, and ketone peroxide. An amount of addition of the organic peroxide is 0.5 to 5 parts by weight with respect to 100 parts of the sealing resin.

The above organic peroxide is combined with the surface sealing material, and the crosslinking and thermal compression bonding can be effected under hot pressing in vacuum. The heating temperature and time can be determined depending upon thermal decomposition temperature characteristics of each organic peroxide. In general, hot pressing is terminated at the temperature and time where thermal decomposition takes place 90%, more preferably 95% or more. The crosslinking of the sealant resin can be checked by measuring gel fractions, and the crosslinking to achieve the gel fraction of 70 wt % or more is desired in order to prevent distortion of the sealant resin at high temperatures.

In order to efficiently undergo the above crosslinking reaction, triallyl isocyanurate (TAIC) called a crosslinking assistant can also be used. In general, an amount of addition of the crosslinking assistant is 1 to 5 parts by weight with respect to 100 parts by weight of the sealant resin.

The surface sealing material used in the present invention is excellent in weather resistance, but an ultraviolet ray absorber may also be added thereto for further improving weather resistance or for protecting the layers below the surface sealing material. The ultraviolet ray absorber is selected from the well-known compounds, and use of a low-volatile ultraviolet absorber is preferred taking account of operating environments of solar cell module. Specific examples are various organic compounds including salicylic acid-based compounds, benzophenone-based compounds, benzotriazole-based compounds, and cyanoacrylate-based compounds.

If a light stabilizer is also added together with the ultraviolet absorber, the sealant will become stabler to the light. Typical light stabilizers are hindered-amine-based light stabilizers. The hindered-amine-based light stabilizers do not absorb ultraviolet rays, different from the ultraviolet ray absorbers, but they demonstrate the prominent synergistic effect when used together with the ultraviolet absorber. Of course, there are other light stabilizers than the hindered-amine-based light stabilizers, but the most of them are colored and thus not preferable for the sealing material in the present invention.

Adding amounts of the above ultraviolet absorber and light stabilizer are desirably 0.1 to 1.0% by weight and 0.05 to 1.0% by weight, respectively, with respect to the sealing resin.

Further, it is also allowed to add an antioxidant in order to improve heat resistance and thermal workability. The antioxidant are of the monophenol type, the bisphenol type, the polymer phenol type, the sulfur type, and the phosphoric acid type. An adding amount of the antioxidant is preferably 0.05 to 1.0% by weight to the filler resin.

If the solar cell module is assumed to be used under severer circumstances, the adhesive strength should be preferably increased between the filler and the photovoltaic device or the surface resin film. Further, when an inorganic compound of fiber is used as the surface covering material, the adhesive strength therewith needs to be enhanced. For that purpose, the silane coupling treatment is effective. Specific examples of silane coupling agents are vinyltrichlorosilane, vinyltris(β methoxyethoxy) silane, vinyltriethoxysilane, vinyltrimethoxysilane, γ-methacryloxypropyltrimethoxysilane, β-(3, 4-epoxycyclohexyl) ethyltrimethoxysilane, γ-glycidoxypropylmethyldiethoxysilane, N-β (aminoethyl) γ-aminopropyltrimethoxysilane, N-β (aminoethyl) γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, and so on.

An adding amount of the silane coupling agent is preferably 0.1 to 3 parts by weight, more preferably 0.25 to 1 part by weight, with respect to 100 parts by weight of the sealing resin.

On the other hand, the surface sealing material must be transparent in order to restrain the decrease in the quantity of light reaching the photovoltaic device as much as possible. Specifically, the light transmittance of the surface sealing material is desirably 80% or more, more desirably 90% or more in the visible light wavelength region of 400 nm to 800 nm. For facilitating incidence of light from the atmosphere, the index of refraction at 25° C. is preferably 1.1 to 2.0, more preferably 1.1 to 1.6.

There are commercially available EVA sheets for solar cell, obtained by molding EVA mixed with the above additives in a sheet shape. The solar cell module can be produced readily by interposing these sheets between the photovoltaic device and a surface member and then hot-pressing them.

(Surface member 405)

Since the surface member 405 used in the present invention is located in the outermost layer of the solar cell module, it needs to have the performance for assuring long-term reliability in outdoor exposure of solar cell module, including transparency, weather resistance, pollution resistance, and mechanical strength. Materials suitably applicable to the present invention are white sheet tempered glass, fluororesin film, acrylic resin film, and so on. Since the white sheet tempered glass has high transparency and high resistance against impact and is hard to break, it is widely used as the surface member of solar cell module. However, recent modules are often required to have light weight and flexibility. In such cases resin films are used as the surface member. Among them, the fluororesin film is often used by choice because of its excellent weather resistance and pollution resistance. Specific examples of the fluororesin are polyvinylidene fluoride resin, polyvinyl fluoride resin, tetrafluoroethylene-ethylene copolymer, and so on. The polyvinylidene fluoride resin is excellent in terms of weather resistance, but the tetrafluoroethylene-ethylene copolymer is excellent in transparency and compatibility of weather resistance and mechanical strength. The thickness of the surface member needs to be thick enough to secure the mechanical strength, but should not be too thick in terms of the cost. Specifically, the thickness is preferably 20 to 200 μm, more preferably 30 to 100 μm.

In order to improve the adhesion to the sealing material, one surface of the resin film is desirably subjected to a surface treatment such as a corona treatment, a plasma treatment, an ozone treatment, UV irradiation, electron beam irradiation, or a flame treatment. Among them, the corona discharge treatment is suitably used, because it can greatly enhance the adhesive strength by use of a relatively simple apparatus with a high treatment rate.

The covering members located on the back (or lower) surface side of photovoltaic device 401 will be described below in detail.

(Back sealing material 406)

The back sealing material 406 used on the non-light-receiving surface side may be the same as the surface sealing material. The desired performance for the back sealing material is that the adhesive strength of the photovoltaic device with the back insulating material and the back member is not lowered under light or heat, in the outdoor operation, in the temperature-humidity cycle test, or the like, rather than that it is not colored under light or heat or the like, demanded on the light-receiving surface side.

For example, when the back member is made from painted, galvanized steel sheet having a surface excellent in weather resistance and rust prevention which is coated with a resin, it is weak particularly in the adhesive strength, thus posing a serious problem as to the long-term reliability. As the resin for the steel, the following resins are used; polyolefin-based resins such as the ethylene-vinyl acetate copolymer (EVA), the ethylene-methyl acrylate copolymer (EMA), the ethylene-ethyl acrylate copolymer (EEA), polyethylene, or the butyral resin; urethane resins, silicone resins or flexible epoxy adhesives. For enhancement of the adhesive strength, these resins for coating the steel are further coated or bonded with the back sealing material. Preferred back sealing materials are polyolefin-based resins such as the ethylene-vinyl acetate copolymer (EVA), the ethylene-methyl acrylate copolymer (EMA), the ethylene-ethyl acrylate copolymer (EEA) and the butyral resin, urethane resins, silicone resins, or the like, which are mixed with a tackiness providing resin, i.e., a tackifier, a coumarone-indene resin, a phenol-formaldehyde resin, a polypentene resin, a xylene-formaldehyde resin, polybutene, rosin, a rosin pentaerythritol ester, a rosin glycerine ester, hydrogenated rosin, a hydrogenated rosin methyl ester, a hydrogenated rosin pentaerythritol ester, a hydrogenated rosin triethylene glycol ester, a polymerized rosin ester, an aliphatic petroleum resin, an alicyclic petroleum resin, a pentadiene resin, α-pinene, β-pinene, a dipentene-based resin, a terpene-phenol resin, or the like. Further, for simplifying the steps, an integrally laminated material in which the adhesive layer of the back sealing material as described above is preliminarily laminated on the both sides of the back insulating member.

(Back insulating member)

The back insulating member 407 is necessary for maintaining the electrical insulation of the electroconductive substrate of photovoltaic device 401 from the outside. A preferred material is one that can assure sufficient electrical insulation to the electroconductive substrate, that is excellent in long-term durability and resistant to thermal expansion and thermal contraction, and that also has flexibility. The films suitably applicable are of nylon or polyethylene terephthalate.

(Back member)

The back member 408 is preferably larger than the photovoltaic device 401. When the solar cell module is installed on the roof or the wall and the like, or when it is a solar cell module integrated with a roof material, the module is preferably used after processed by folding. The folding enables the module to be installed without a need for attachment of a frame or the like, and the solar cell module can be produced and installed more easily and cheaply by reduction of raw-material costs necessary for the frame and accessories and by decrease of the step of attachment of frame. For this purpose, the back member 408 is preferably greater than the photovoltaic device, thereby enabling complex working without exerting stress on the photovoltaic device 401.

The back member 408 is necessary for increasing the mechanical strength of solar cell module or for preventing distortion or warp due to the temperature change. Specifically, preferred materials for the back member are a steel sheet, a plastic sheet, and an FRP (glass fiber reinforced plastic) sheet. Specifically, the back member of steel sheet is excellent in workability such as folding and can be brought to the commercial stage without employing attachment of frame, used heretofore. The solar cell module can be used as incorporated with a roof or wall material, which is also very effective in terms of the cost reduction and simplification of production steps. Further, when a steel sheet coated with a resin is used as a reinforcing material, the solar cell module can be obtained with high reliability and with excellent weather resistance and rust prevention.

Now, described referring to FIG. 4 is a method for forming the solar cell module, using the above-stated photovoltaic device, surface protecting and reinforcing material, surface sealing material, surface member, back sealing material, back insulating member, and back member.

The light-receiving surface of photovoltaic device 401 is normally coated by a method for producing the surface sealing material 404 in the sheet shape and for hot-pressing it on the top and bottom surfaces of the photovoltaic device 401. The coating structure of the solar cell module is as shown in FIG. 4. Specifically, the photovoltaic device 401, thin-film resin layer 402, surface protecting and reinforcing material 403, surface sealing material 404, surface member 405, back sealing material 406, back insulating member 407, back sealing material 406, and back member 408 are stacked in the order of FIG. 4 or in the reverse order and hot-pressed to form the module. The decorative tape 409 is laid on the positive electrode busbars 505. However, the layers are stacked preferably in the order of FIG. 4 such that the surface member 405 is stacked in an upper position, for coating the photovoltaic device with a small amount of filler.

The heating temperature and heating time upon hot-press bonding are determined to be those at which the crosslinking reaction takes place sufficiently.

The method of hot-press bonding can be selected from a variety of the conventional methods including the double vacuum evacuation method, the single vacuum evacuation method, and roll lamination. Among them, the heat compression bonding by the single vacuum evacuation method is a preferred method, because the solar cell module can be produced easily by a cheap apparatus.

Examples of the present invention will be described in detail by reference to the drawings, but it is noted that the present invention is by no means intended to be limited to these examples.

EXAMPLE 1

Figure 6:
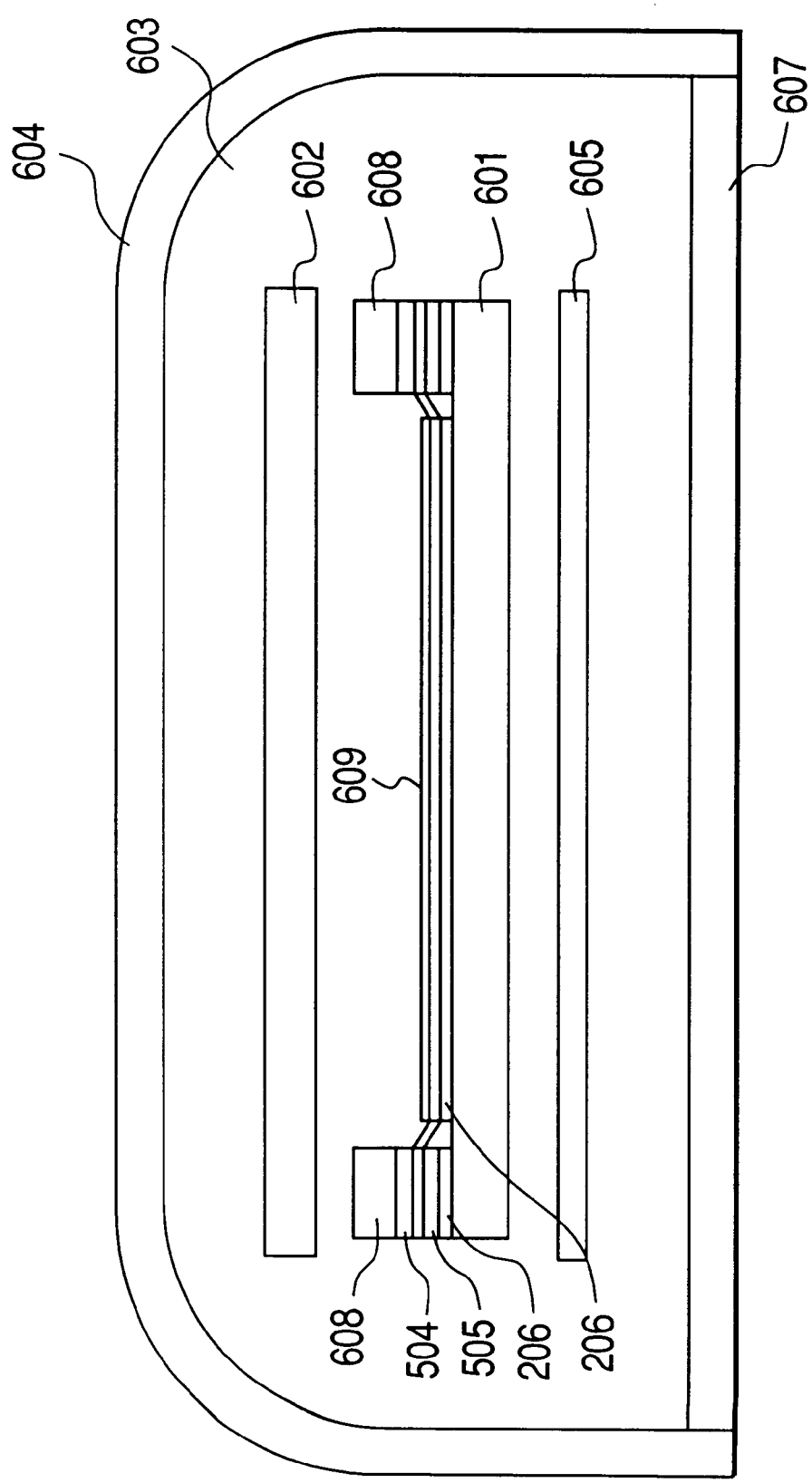
FIG. 6 is a schematic cross-sectional view to show the structure of a solar cell module according to Example 1 of the present invention.

In the present example, the thin-film resin layer was formed on the electric power-generating region of photovoltaic device forming the solar cell module shown in FIG. 6. After the thin-film resin layer formed on the semiconductor layer was charged from the worker and after the tweezers were dropped on the thin-film resin layer, whether the semiconductor layer was damaged or not was checked by measuring the shunt resistance thereof. The thin-film resin layer was an acrylic urethane resin film. Thicknesses of the thin-film resin layer were changed with necessity in order to change the electrostatic withstand voltage of photovoltaic device.

The method for forming the photovoltaic device will be described according to the production procedures thereof.

(1) A carbon paste was prepared as follows in order to form the conductive adhesive 303 for forming the coating layer of collector electrode, as shown in FIGS. 3A and 3B.

(i) A mixed solvent of 2.5 g of ethyl acetate and 2.5 g of IPA as a solvent was charged into a shake bottle for dispersion.

(ii) 22.0 g of an urethane resin to become the main component was added into the shake bottle and the mixture was fully stirred by ball mill.

(iii) 1.1 g of block isocyanate as a curing agent and 10 g of glass beads for dispersion were added to the above solution.

(iv) 2.5 g of carbon black having the mean primary particle size of electroconductive particles of 0.05 $\mu$m was added to the above solution.

(2) After the materials were charged into the shake bottle as in the above (1), they were dispersed for 10 hours by a paint shaker. After that, the glass beads for dispersion were taken out of the electroconductive adhesive thus produced. The mean particle size of the electroconductive adhesive was measured and was approximately 1 $\mu$m. The same result was obtained by use of beads mill instead of the paint shaker.

(3) The electroconductive adhesive obtained in the above (2) was cured under the standard curing conditions of the curing agent; 160° C., 30 minutes, and then the volume resistivity thereof was measured and was 10 $\Omega$cm, thus confirming that the resistance was sufficiently low.

(4) Using a wire coating machine not shown in the drawings, the electroconductive adhesive 303 was applied as a coating layer onto wires and was dried, thus forming the collector electrodes. The application rate was 40 m/min, the residence time was 2 sec, and the temperature of a drying furnace was 120° C. Five separate coatings were conducted. The pore diameter of dies for enamel coat used was 150 $\mu$m to 200 $\mu$m. The conductive adhesive 303 coating the wires 302 existed in an uncured state while the solvent volatilized. Layer thicknesses of the electroconductive adhesive 303 were 20 $\mu$m on average and variations in the thicknesses were within ±1.5 $\mu$m in the results of coating 100 m long.

(5) The photovoltaic device shown in FIGS. 2A and 2B was produced using the collector electrodes 300 produced in the above step of (4). The flexible substrate 201 was a substrate of SUS 430BA. Using a DC sputtering apparatus not shown in the drawings, layers of Ag 400 nm thick and ZnO 400 nm thick as the first electrode 202 were formed on the flexible substrate 201 which was degreased and cleaned.

(6) Semiconductor layers of the triple cell type described below were formed on the first electrode 202, using a microwave plasma enhanced CVD apparatus not shown in the drawings.

(i) The bottom layer was formed by depositing the n-type layer 203, i-type layer 204, and p-type layer 205 in this order on the first electrode 202. At this time, the i-type layer 204 was of a-SiGe.

(ii) The n-type layer 213, i-type layer 214, and p-type layer 215 were deposited in the named order on the bottom layer, thereby forming the middle layer. The i-type layer 214 was also of a-SiGe as in the bottom layer.

(iii) The n-type layer 223, i-type layer 224, and p-type layer 225 were deposited in the named order on the middle layer, thereby forming the top layer. The i-type layer was of a-Si.

(7) On the light incidence side of the semiconductor layers, i.e., on the top layer, a transparent, electroconductive layer of ITO was formed as the transparent electrode 206, using a vapor deposition apparatus of resistance heating not shown in the drawings. Through the above steps, the photovoltaic device 200 was produced.

(8) From the photovoltaic device 200 obtained in the step (7), unnecessary parts of the transparent, electroconductive layer were removed with an etching paste the main component of which was ferric chloride, by a commercially available printing machine so that the size of the photovoltaic device (cell) was 30 cm×30 cm and the effective area was 900 cm$^2$.

(9) Negative electrode busbars of copper foil 100 $\mu$m thick were placed by spot welding on parts of the non-light-receiving surface side of the photovoltaic device obtained in the step (8).

(10) As shown in FIGS. 5A and 5B, an insulating tape was bonded to the non-electric power-generating region on the light-receiving surface side of the photovoltaic device 501 obtained in the step (9) and the collector electrodes 503 were arranged at intervals of 5.5 mm to be fixed on the adhesive material.

(11) The positive electrode busbars 504 were made of copper foil obtained by coating soft copper with silver plate and the positive electrode busbars 504 were formed on the collector electrodes 503 and adhesive material 505.

(12) For bonding the collector electrodes 503 to the cell surface of photovoltaic device, they were hot-pressed by a heating machine not shown in the drawings. The heating conditions were 200° C., 1 min, and the pressure of 1 kg/cm$^2$.

(13) For bonding the collector electrodes 503 to the positive busbars 504, they were heated and compressed using the heating machine not illustrated. The heating conditions were 200° C., 15 sec, and the pressure of 5 kg/cm$^2$.

(14) On the electric power-generating region of the photovoltaic device obtained through the steps up to the above (13), an acrylic urethane paint was applied to the light-receiving surface side of photovoltaic device by airless spray coating, and after drying of solvent, it was heated at 200° C. for 10 minutes to harden, thereby providing the thin-film resin layer 510.

(i) By the above method, 100 samples were produced for each of thicknesses 0.5, 1, 5, 10, 20, and 30 $\mu$m of the thin-film resin layer 510. The photoelectric conversion efficiency was measured for each sample under 700 Lux. After that, these samples were subjected to the works "series connection" and "module formation" as described below, and they were evaluated as to the decrease rate of the photoelectric conversion efficiency after the work.

[Series connection]

Next described is a method for producing a photovoltaic device array by connecting photovoltaic devices in series after completion of the above evaluation.

The devices were aligned and thereafter the adjacent devices were connected by soldering the positive electrode busbars of one device to the negative electrode busbars of another device. By this, the two photovoltaic devices were connected in series. On this occasion, copper tabs connected to the output terminals of the devices at the outside ends were routed to the bottom surface so that the output was able to be taken out through holes of the back covering layer as described hereinafter. In this way, the photovoltaic devices were connected in series in units of two each on a non-electroconductive table mat under the circumstance of temperature 22° C. and moisture 35% RH.

[Module formation]

Next described referring to FIG. 6 is a method for producing the solar cell module by coating the above photovoltaic device array.

In FIG. 6, numeral 601 designates a photovoltaic device array, 602 a surface protecting and reinforcing material (80 g/m$^2$), 603 a surface sealing material, 604 a surface member, 605 a back covering material, 607 a back member, 608 a decorative tape, and 609 a transparent, thin-film resin layer. The solar cell module was produced by stacking these layers.

(Surface protecting and reinforcing member)

Prepared as the surface reinforcing member (80 g/m$^2$) 602 was a nonwoven fabric of glass fiber containing an acrylic resin adhesive of 4.0%, the glass fiber nonwoven fabric having the basis weight of 80 g/m$^2$, the thickness of 400 µm, and the fiber diameter of 10 µm.

(Surface sealing material)

The surface sealing material 603 was a sheet 460 µm thick which was made from a mixture containing 100 parts by weight of ethylene-vinyl acetate (vinyl acetate 33% by weight, the melt flow rate 30) as a filler, 1.5 parts by weight of 2, 5-dimethyl-2, 5-bis (t-butylperoxy) hexane as a crosslinking agent, 0.3 part by weight of 2-hydroxy-4-n-octoxybenzophenone as a UV absorber, 0.2 part by weight of tris (mono-nonylphenyl) phosphite as an antioxidant, and 0.1 part by weight of (2, 2, 6, 6-tetramethyl-4-piperidyl) cevacate as a light stabilizer.

(Surface member)

The surface member 604 was a non-oriented ethylene-tetrafluoroethylene film (50 µm thick). The surface of the surface member to be bonded to the surface sealing material 603 was preliminarily subjected to the plasma treatment.

(Back covering material film)

The insulating film 605 as the back covering material film was an integral lamination of the back sealing material and a back insulating member. The back sealing material was the ethylene-ethyl acrylate copolymer (EEA, 200 µm thick) and polyethylene (PE) resin (25 µm thick), and the back insulating member was a biaxially oriented polyethylene terephthalate film (PET, 50 µm thick). These were integrally stacked in the order of EEA/PE/PET/PE/EEA to obtain the integral lamination film of the total thickness of 500 µm.

(Back member)

Prepared as the back member 607 was a steel sheet obtained by coating one surface of a galvanized steel sheet (an aluminum-zinc alloy plated steel sheet integrally containing aluminum 55%, zinc 43.4%, and silicon 1.6%) with a polyester-based paint and by coating the other surface thereof with a polyester-based paint to which glass fibers were added. The thickness of the steel sheet was 400 µm.

(Decorative tape)

Prepared as the decorative tape 608 was a film of EVA/PET/EVA in which the ethylene-vinyl acetate copolymer (460 µm thick) was integrally laid on the both sides of a polyethylene terephthalate (PET) film (50 µm thick, color: black).

(Dimensions of the respective components)

The surface protecting and reinforcing material 602 was prepared which had 5 mm larger each side than the photovoltaic device. The back covering material 605 was prepared which had 15 mm larger each side than the photovoltaic device. The back member 607 was prepared which had 80 mm larger each side than the photovoltaic device. The surface sealing material 603 and surface member film 604 were prepared which had 90 mm larger each side than the photovoltaic device. The decorative tape 608 was prepared which had the width of 20 mm and the same length as that of the photovoltaic device.

(Lamination step)

The lamination step as described below was carried out under the environment of room temperature 20° C. and humidity 35% RH.

(1) The components were stacked in the order of surface member film 604/surface sealing material 603/surface protecting and reinforcing material (80 g/m$^2$) 602/photovoltaic device 601/back covering material 605/back member 607 to obtain a laminate body. The decorative tape 608 was laid on the collector electrodes. During the stacking step, for adjusting alignment, several re-stacking and shifting operations were performed of the surface member 604, surface sealing material 603, and surface protecting and reinforcing material (80 g/m$^2$) 602 laid on the photovoltaic device.

(2) This laminate body was placed on a plate of a laminate device of the single vacuum chamber system with the surface member (ETFE film) 604 facing up, and a silicone rubber sheet was laid thereon.

(3) Then a vacuum pump was actuated to evacuate through a perforated pipe, thereby attaching the rubber to the plate. The evacuation rate at this time was 76 Torr/sec and the evacuation was continued in the inside vacuum degree of 5 Torr for 30 minutes.

(4) This plate was put into a hot air oven preliminarily set in an atmosphere of 150° C. After the temperature of the plate was increased to 150° C., the temperature was maintained for 30 minutes to undergo melting and crosslinking reaction of EVA used as the surface sealing material.

(5) After that, the plate was taken out of the oven and air was sent thereto by a fan to cool the plate down to approximately 40° C. Then the evacuation was stopped and the solar cell module was taken out.

(6) After taken out, the covering material larger than the back member was cut at the edges of the back member and, further, the longitudinal edges of the back material were folded. The output terminals were preliminarily routed to the back surface of photovoltaic device, so that the output could be taken out through the terminal outlets preliminarily formed in the galvanized steel sheet, after the lamination.

(Evaluation)

(1) Table 1 shows measurement results of photoelectric conversion efficiency of the samples described in the above (14), (i) and shows the relationship between the average thickness of the thin-film resin layer and the decrease rate of photoelectric conversion efficiency. In Table 1, each ○ mark described in the row of result indicates a case wherein the decrease rates of the all samples were less than 10%, each Δ mark a case wherein 95% or more of the all samples showed the decrease rates of less than 10%, and each × mark a case wherein samples of less than 95% of the all samples showed the decrease rates of less than 10%.

TABLE 1

| Thickness (µm) | 0.5 | 1.0 | 5.0 | 10.0 | 20.0 | 30.0 |
|---|---|---|---|---|---|---|
| Result | x | x | Δ | ○ | ○ | ○ |

From Table 1, it is seen that the decrease rates were improved when the average thickness of the thin-film resin layer was not less than 5 µm and, particularly, that the effect was outstanding when the average thickness was not less than 10 µm.

Figure 7A:
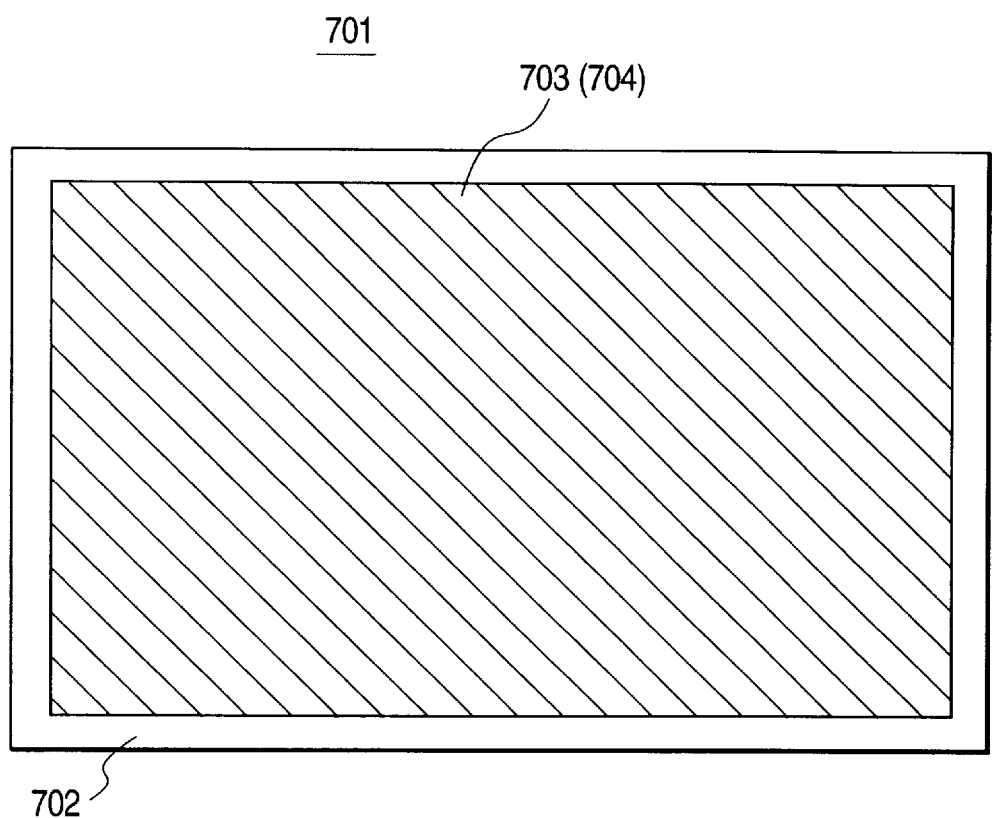
FIGS. 7A and 7B are schematic plan view and cross-sectional view to show a measuring state of open voltage (Voc)
Figure 7B:
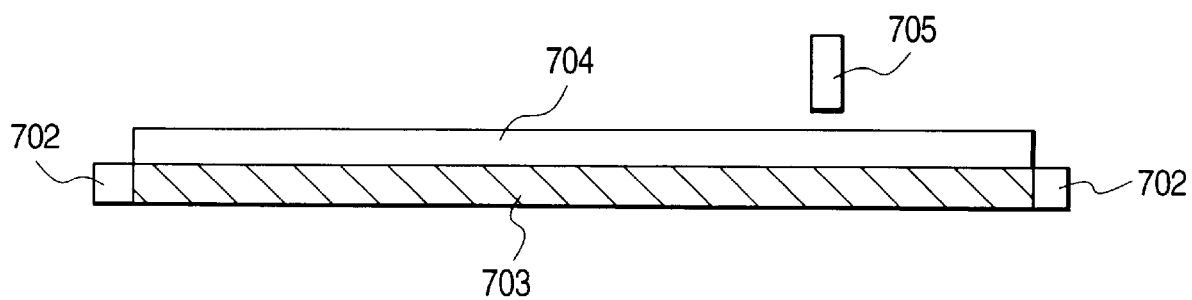

(2) Samples of photovoltaic device were prepared in thicknesses of the thin-film resin layer of 0.5, 1, 5, 10, 20, and 30 µm, and open voltage (Voc) thereof under 700 Lux was measured while applying the voltage of 1 kV through probe 705 onto the thin-film resin layer 704 provided in the electric power-generating region of photovoltaic device 701, as shown in FIGS. 7A and 7B. After that, the applied voltage was increased in 1 kV steps, and the electrostatic withstand voltage was defined as an applied voltage at the open voltage lowered by 10 % of the initial Voc value.

Table 2 shows electrostatic withstand voltages of the respective samples. FIG. 1 shows the relationship between the electrostatic withstand voltage and the percentage of samples with the decrease rate of photoelectric conversion efficiency being less than 10%, obtained from Table 1 and Table 2. It is seen that the samples with the electrostatic withstand voltage being not less than 5 kV show no reduction or very little reduction in the conversion efficiency after the lamination work.

TABLE 2

| Thickness ($\mu$m) | 0.5 | 1.0 | 5.0 | 10.0 | 20.0 | 30.0 |
|---|---|---|---|---|---|---|
| Static withstand voltage (kV) | 3.0 | 4.0 | 5.0 | 8.0 | 20.0 | 22.0 |

Figure 9:
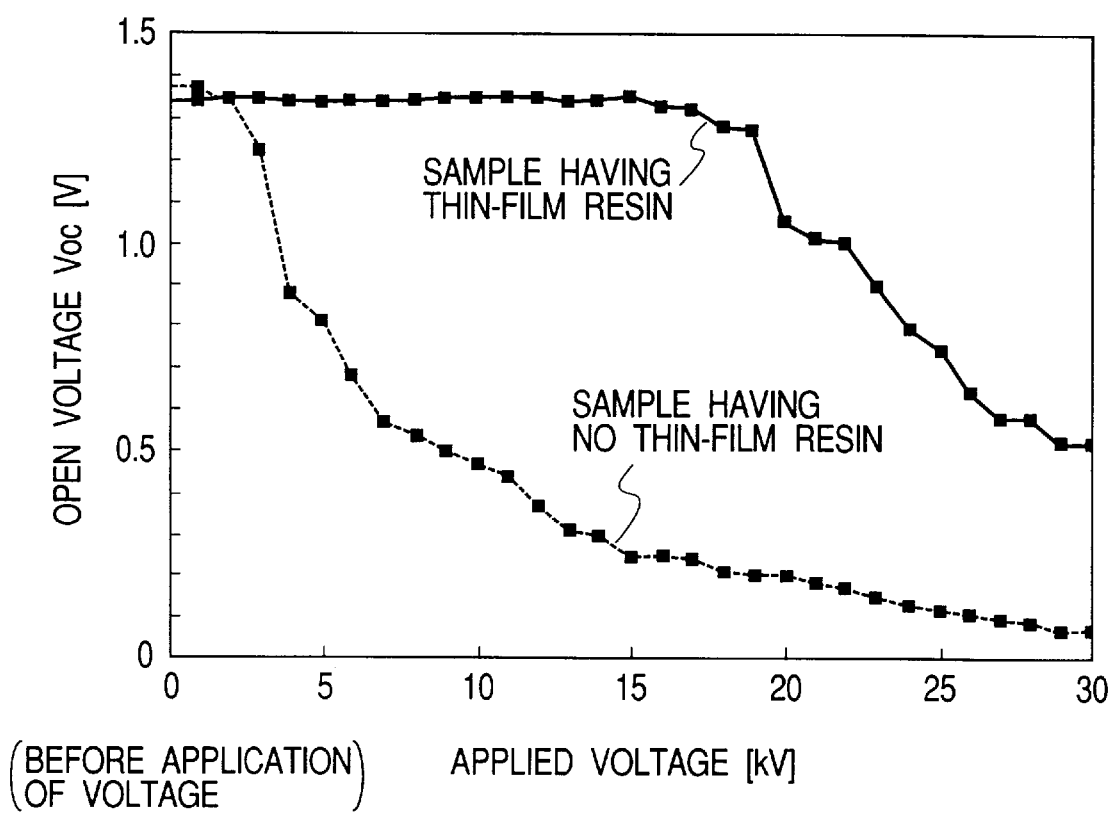
FIG. 9 is a graph to show the relationship between a voltage applied and an open-circuit voltage when photovoltaic devices were used in the solar cell module according to the present invention.

FIG. 9 shows the relationship between applied voltage and open voltage (Voc) where the thin-film resin layer having the average thickness of 20 $\mu$m was provided. The figure also shows a case without the thin-film resin layer as a comparative example.

It was verified that the electrostatic withstand voltage was increased with increase in the thickness of the thin-film resin layer and, particularly, that the high electrostatic withstand voltages of 20 kV or more were obtained when the thickness was 20 $\mu$m or more.

Based on the above knowledge, initial performance evaluation described below was conducted for the samples with the thin-film resin layer having the average thickness of 20, 30, 40, 50, 60, 80, or 100 $\mu$m by using the samples prepared in above step (14).

Evaluation (a): For the samples, voltage-current characteristics were measured and the shunt resistance was determined from the slope near the origin. They showed good values of 200 k$\Omega$cm$^2$ to 500 k$\Omega$cm$^2$. In the individual samples, the decrease of shunt resistance and open voltage (Voc) was less than 10% even after application of the voltage of 5 kV.

Evaluation (b): The solar cell performance was measured using an artificial sunlight source (hereinafter referred to as "simulator") under a global sunlight spectrum of AM 1.5 and the light volume of 100 mW/cm$^2$ to obtain the photoelectric conversion efficiency. The conversion efficiency was 8.5%±0.02%, thus exhibiting the good performance with little variation.

The following evaluations were carried out for the solar cell modules after completion of the above lamination step.

Evaluation (c): The initial appearance was observed. The unevenness on the solar cell device was also filled fully with the filler, thus obtaining the good result.

Evaluation (d): The samples were put in a thermohygrostat the temperature and humidity of which were controllable. The samples were stored under the environment of temperature 85° C. and relative humidity 85% RH and the bias voltage of 0.7 V was applied thereto in the forward bias direction to observe change in the shunt resistance. The reduction of the photoelectric conversion efficiency was 2% on average from the initial conversion efficiency, thus indicating no significant deterioration.

Evaluation (e): These samples were subjected to the temperature-humidity cycle test of 1000 hours. After the test, the appearance of the samples was observed. Exfoliation was observed between the thin-film resin layer and the transparent, organic polymer resin in the samples having the thickness over 60 $\mu$m.

From the above-stated results, it became apparent that the solar cell modules with good static withstand voltage characteristics were obtained by the arrangement wherein the thin-film resin layer having the average thickness of 20 $\mu$m to 60 $\mu$m was provided on at least the electric power-generating region on the light-receiving surface side of photovoltaic device.

EXAMPLE 2

The present example is different from Example 1 in that the layers were successively stacked with the light-receiving surface of photovoltaic device facing down upon the lamination of photovoltaic device. The thin-film resin layer used was the acrylic urethane resin film (the average thickness of which was 20 to 30 $\mu$m).

The solar cell module was produced in the same manner as in Example 1 except for the above point.

The same evaluations as in Example 1 were conducted and good results were obtained; the initial shunt resistance was 300 to 400 k$\Omega$cm$^2$; the initial conversion efficiency was 8.3±0.15%; the shunt resistance and conversion efficiency after the series connection both showed only the decrease of not more than 2%; the shunt resistance and conversion efficiency after the lamination also showed only the decrease of not more than 2% with respect to the initial shunt resistance and conversion efficiency.

With the solar cell module of the present example, however, the appearance thereof after the lamination was such that the unevenness on the photovoltaic device was not filled sufficiently.

EXAMPLE 3

The present example is different from Example 1 in that the lamination was conducted before the series connection of photovoltaic devices and the photovoltaic devices after the lamination were connected in series. The thin-film resin layer used was the acrylic urethane resin film (the average thickness of which was 20 to 30 $\mu$m).

The solar cell module was produced in the same manner as in Example 1 except for the above.

The same evaluations as in Example 1 were conducted and good results were obtained; the initial shunt resistance was 200 to 600 k$\Omega$cm$^2$; the conversion efficiency was 8.2±0.08%; the shunt resistance and conversion efficiency after the lamination showed only the decrease of not more than 1% as compared with the initial shunt resistance and conversion efficiency.

With the solar cell module of the present example, however, the percentage of the non-electric power-generating region on the light-receiving surface side increased, so that the electric power generated per area was smaller than in Examples 1 and 2.

Comparative Example 1

This comparative example is different from Example 1 in that no thin-film resin layer was formed.

The solar cell module was produced in the same manner as in Example 1 except for the above.

The same evaluations as in Example 1 were conducted and good results were obtained as to the initial characteristics of photovoltaic device. However, after the series connection, Voc under 200 Lux showed the decrease of 40 to 60% and the shunt resistance showed the decrease of 50 to 90%. The conversion efficiency also decreased by 3 to 5%. These values did not change even after the lamination.

Comparative Example 2

This comparative example is different from Example 1 in that a thin-film layer of $SiO_2$ was formed by the CVD method, instead of the thin-film resin layer.

The solar cell module was produced in the same manner as in Example 1 except for the above.

The same evaluations as in Example 1 were conducted and good results were obtained as to the initial characteristics.

However, the sufficient thickness was not obtained by evaporation of $SiO_2$ in the CVD method, and the film was found to be not enough to function as an insulating protective film. The shunt resistance after the series connection decreased by 40 to 70%. The conversion efficiency also decreased by 1 to 4%. These values did not change even after the lamination.

Table 3 shows the all evaluation results of the Examples 1 to 3 and Comparative Examples 1 to 2 described above.

(e) Since the thin-film resin layer is formed by the film coating method, the thin-film resin layer can be selectively formed in a part of the light-receiving surface side of photovoltaic device.

(f) In the production method of the solar cell module obtained by sealing the photovoltaic device having the thin-film resin layer thereon with the resin, the amount of the resin necessary for filling the unevenness on the photovoltaic device can be decreased, because the photovoltaic device is placed on the support substrate with the light-receiving surface side facing up, thereafter the surface sealing material and surface member are successively stacked on the light-receiving surface side of the photovoltaic device, and then the lamination is carried out by heating in vacuum. This means that the resin highly combustible is decreased, thus attaining the production method of the solar cell module excellent in flame resistance. The decrease in the amount of resin used also permits reduction of cost.

As described above, the present invention can provide the solar cell module and the production method thereof capable of protecting the semiconductor layer and maintaining high reliability, even if the charged worker or apparatus touches the photovoltaic device to induce discharge. As a result, the yield in production can be increased. In addition, the present

TABLE 3

| | Before lamination | | | | After lamination | | | | |
|---|---|---|---|---|---|---|---|---|---|
| | Initial performance | | Series connection | | Appearance | | Performance | | Temp. |
| | Shunt resistance | Conversion efficiency | Shunt resistance | Conversion resistance | Filling property | Power-generating area/non-generating area | Shunt resistance | Conversion efficiency | cycle test |
| Ex. 1 | ○ | ○ | ○ | ○ | ○ | ○ | ○ | ○ | ○ |
| Ex. 2 | ○ | ○ | ○ | ○ | Δ | ○ | ○ | ○ | ○ |
| Ex. 3 | ○ | ○ | ○ | ○ | ○ | Δ | ○ | ○ | ○ |
| Comp. Ex. 1 | ○ | ○ | x | x | ○ | ○ | x | x | x |
| Comp. Ex. 2 | ○ | ○ | x | x | ○ | ○ | x | x | x |

The following points were clarified by the Examples and Comparative Examples.

(a) Since the photovoltaic device has the electrostatic withstand voltage of not less than 5 kV before the lamination, the semiconductor layer can be prevented from being damaged, even if the worker with charge touches the semiconductor layer of photovoltaic device to induce discharge.

(b) In the lamination step, the photovoltaic device can also be protected from the static electricity generated when the resin or/and the nonwoven fabric of glass fibers are shifted or rearranged on the photovoltaic device in order to achieve alignment between the photovoltaic device and the covering materials.

(c) During the series or parallel connection of photovoltaic devices, the photovoltaic devices can be protected from the mechanical or thermal impact such as dropping of tweezers onto the photovoltaic device or soldering.

(d) The series or parallel connection of at least two photovoltaic devices permits the lamination to be performed after they are combined in a large-area form of photovoltaic device. This improves the poor work efficacy due to a plurality of laminations of small- area photovoltaic devices. It also allows reduction in the percentage of non-electric power-generating region with respect to the area of installation.

invention can provide the solar cell module with high moisture resistance.

What is claimed is:

1. A photovoltaic device having an electrostatic withstand voltage of not less than 5 kV.

2. A photovoltaic device according to claim 1, wherein a thin-film resin layer is provided on an electric power-generating region of a light-receiving surface side of said photovoltaic device.

3. A photovoltaic device according to claim 2, wherein said thin-film resin layer comprises as a main component a resin selected from the group consisting of an acrylic resin, a silicone resin, and a fluororesin.

4. A photovoltaic device according to claim 2, wherein said thin-film resin layer is a layer obtained by thermally crosslinking an acrylic resin and an inorganic polymer with a blocking isocyanate.

5. A photovoltaic device according to claim 2, wherein a collector electrode is provided on the light-receiving surface side of said photovoltaic device and said thin-film resin layer in a top part of said collector electrode is thinner than in portions except for the top part, or absent.

6. A photovoltaic device according to claim 2, wherein a collector electrode is provided on the light-receiving surface side of said photovoltaic device, said collector electrode is connected to a busbar, and said busbar is not covered by said thin-film resin layer.

7. A photovoltaic device according to claim 2, wherein an average thickness of said thin-film resin layer is not less than 5 μm.

8. A photovoltaic device according to claim 2, wherein said thin-film resin layer is formed by a spray coater, a spin coater, a curtain coating, or a film coating.

9. A photovoltaic device array produced by electrically connecting a plurality of the photovoltaic devices as set forth in any one of claims 1 to 8.

10. A solar cell module produced by sealing the photovoltaic device as set forth in any one of claims 1 to 8 with a filler resin.

11. A solar cell module according to claim 10, wherein a nonwoven fabric of glass fibers is contained in said filler resin.

* * * * *

UNITED STATES PATENT AND TRADEMARK OFFICE
CERTIFICATE OF CORRECTION

PATENT NO. : 5,973,258
DATED : October 26, 1999
INVENTOR(S) : Shiotsuka et al.

It is certified that error appears in the above-identified patent and that said Letters Patent is hereby corrected as shown below:

<u>Title page,</u>
Item [57], ABSTRACT, please delete entire ABSTRACT and insert ABSTRACT that is attached Please delete columns 1-22 in its entirty and insert the new columns 1-22 on attached pages Signed and Sealed this Seventh Day of June, 2005

JON W. DUDAS
*Director of the United States Patent and Trademark Office*

ABSTRACT OF THE DISCLOSURE

The present invention provides a solar cell module comprising a photovoltaic device and a production method thereof. Since the photovoltaic device has a high electrostatic withstand voltage and high reliability, a high yield is obtained in a production process before a step of sealing the photovoltaic device in a resin. The solar cell module of the present invention is a solar cell module produced by sealing with a resin a photovoltaic device having at least one layer of a semiconductor photoactive layer as a light converting member, and collector electrodes formed on a light-receiving surface side of the semiconductor photoactive layer, wherein the photovoltaic device before the resin sealing has the electrostatic withstand voltage of not less than 5 kV. The production method of the solar cell module comprises sealing with a resin the photovoltaic device provided with the thin-film resin layer, wherein the photovoltaic device is placed on a support substrate with the light-receiving surface side facing up, thereafter a filler and a fluorine film are successively stacked on the light-receiving surface side of the photovoltaic device, and the resin sealing is effected by heating in vacuum.

- 1 -

TITLE

PHOTOVOLTAIC DEVICE

BACKGROUND OF THE INVENTION

Field of the Invention

The present invention relates to a photovoltaic device that can be protected from electrostatic voltage even when touched by a charged worker.

Related Background Art

In recent years, awareness of environmental problems has been increasing on a worldwide scale. Among others, concern is deep over the global warming phenomenon due to the emission of $CO_2$, and desires for a clean energy source have become stronger and stronger. At present, solar cells can be considered to be one of the hopes as a clean energy source because of their safety and ease in handling.

There are a variety of solar cells, for example, typified by crystal silicon solar cells, polycrystal silicon solar cells, amorphous silicon solar cells, copper indium selenide solar cells, compound semiconductor solar cells, and so on. Among them, the

- 2 - thin-film crystal silicon solar cells, compound semiconductor solar cells, and amorphous silicon solar cells have recently been actively researched and developed in various fields, because they can be formed in a large area at relatively low cost.

The cost of the solar cells now available is, however, still high, and it is thus necessary to further decrease the cost thereof. For that purpose, problems to be solved are, for example, as follows.

(i) Efficient utilization of electric power generating region (ii) Reductions in costs for connecting members at connecting portions and labor costs for connection In order to improve above (i), it is necessary to increase the percentage of the electric power-generating region with regard to the area where the solar cell is installed. In order to improve above (ii), it is necessary to increase the area of a given solar cell.

Figure 8A:
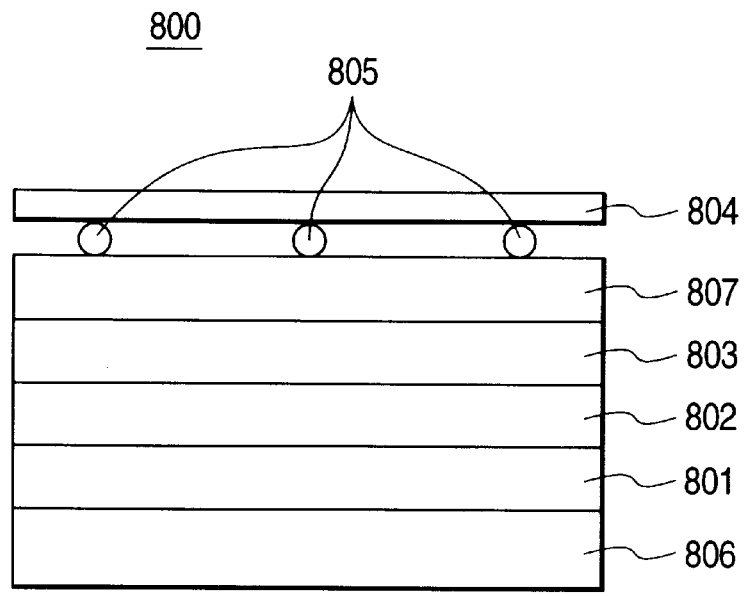
FIG. 8A is a schematic cross-sectional view to show the structure of a photovoltaic device used in a conventional solar cell module.
Figure 8B:
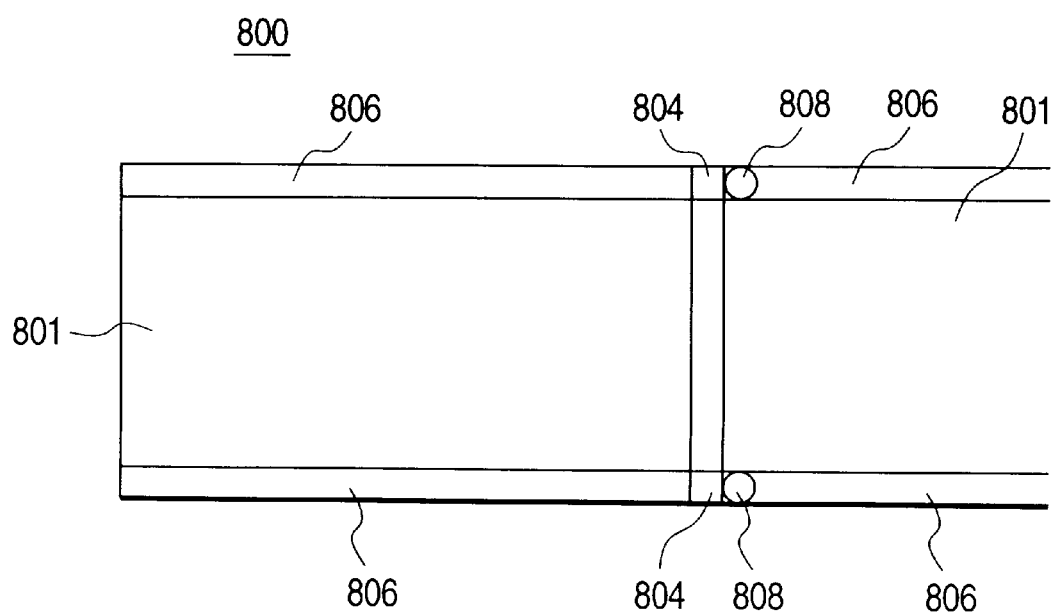
FIG. 8B is a schematic plan view to show a state of two conventional photovoltaic devices connected.

Figs. 8A and 8B are schematic views showing a conventional photovoltaic device improved in above (i) and (ii).

In Figs. 8A and 8B, reference numeral 800 designates a photovoltaic device, 801 a flexible substrate, 802 a semiconductor layer, 803 a transparent electrode layer, 804 a positive electrode busbar, 805 collector electrodes, 806 negative electrode busbars, 807 an insulating tape and 808 solder. One end of the positive electrode busbar 804 of one photovoltaic device is soldered to a portion of the negative electrode busbar 806 of another adjacent photovoltaic device, thereby connecting these two photovoltaic devices. This
connection is repeated with a plurality of photovoltaic
devices to obtain a solar cell module.

The photovoltaic devices described above, however, have
a low electrostatic withstand voltage and therefore
experience the following problems. Here, the
electrostatic withstand voltage in the present
invention means a value of applied voltage that causes
a 10% decrease of Voc under 200 Lux between, before and
after application thereof, when an arbitrary voltage is
applied to the electric power-generating region of a
light-receiving surface.

(1) The electrode busbars-leading structure as shown in
Figs. 8A and 8B can decrease the non-electric
power-generating region on the light-receiving surface
side as compared with a case of leading both of the
positive and negative electrode busbars on the light-
receiving surface side. However, in order to minimize
the effect of a flux used in soldering on the light-
receiving surface of a photovoltaic device in a series
connection step, the series connection needs to be
conducted while keeping the light-receiving surface
side of the photovoltaic device facing down. On that
occasion, a tool used for the series connection might
rub the light-receiving surface of the photovoltaic
device to generate the static electricity. When the
charged tool or worker touches the photovoltaic device,
the electricity will be discharged to the photovoltaic
device in some cases. This sometimes results in
damaging the semiconductor layer of the photovoltaic
device.

(2) For sealing the photovoltaic device with a resin,
filler films or glass fibers are stacked on the
light-receiving surface side, and thereafter the filler film is shifted for adjustment of alignment or the stacking is done over again, whereupon the static electricity will be generated. This sometimes results in damaging the semiconductor layer of the photovoltaic device and thus failure to achieve sufficient electrical characteristics. Present countermeasures against static electricity include a wrist band, a table mat, a floor mat, or installation of the earth for prevention of charging; but these are far from sufficient.

(3) The photovoltaic devices are sometimes packed and conveyed before the sealing thereof with the resin. On that occasion, a spacer of slipsheet or foam is interposed between photovoltaic devices. When the photovoltaic devices are moved or taken out, friction generates the static electricity. The use of a spacer of slipsheet or foam for prevention of charging caused increase of cost, since reuse thereof was difficult.

SUMMARY OF THE INVENTION

An object of the present invention is to provide a photovoltaic device with high electrostatic withstand voltage and with high reliability and a production method thereof capable of achieving a high yield in a production process before a step of sealing the photovoltaic device with the resin.

The inventors conducted extensive and intensive research and development for solving the above problems and found that the following structure was best.

(1) A solar cell module of the present invention is a solar cell module obtained by carrying out resin sealing (hereinafter, simply referred to as "lamination") such as sealing with a resin sheet or the like a photovoltaic device comprising at least one
semiconductor photoactive layer as a photoelectric
converting member and a collector electrode formed on
the light-receiving surface side of the aforementioned
semiconductor photoactive layer, wherein the
photovoltaic device before the lamination has an
electrostatic withstand voltage of not less than 5kV.

Since the photovoltaic device before the lamination has
the electrostatic withstand voltage of not less than
5kV, the semiconductor layer of the photovoltaic device
can be prevented from being damaged even when a charged
worker or a manufacturing or measuring instrument
touches the semiconductor layer to induce discharge. As
a result, the yield is increased in the production
steps of the photovoltaic device.

In the resin-sealing (or lamination) step, the
photovoltaic device can also be protected from the
static electricity generated when a filler film or/and
a nonwoven fabric of glass fibers are shifted on the
photovoltaic device or when the stacking thereof is
done over again, in order to achieve alignment between
the photovoltaic device and the resin.

(2) Since a thin-film resin layer is provided on at
least the electric power-generating region of the
light-receiving surface side of the photovoltaic
device, the photovoltaic device can have the
electrostatic withstand voltage of not less than 5kV.
During the work for connecting the photovoltaic devices
in series or in parallel, the photovoltaic devices can
be protected from mechanical or thermal impact such as
the drop of tweezers onto the photovoltaic device or
contact with solder, which is normally considered to
induce deterioration of the device.

(3) At least two photovoltaic devices described above are connected in series or in parallel, whereby the lamination can be done after formation of a large-area photovoltaic device array. This can avoid undesirable, repetitious lamination of photovoltaic devices of small area. It can also decrease the percentage of the non-electric power-generating region with regard to the installation area.

(4) The thin-film resin layer is formed by a film coat method, whereby the thin-film resin layer can be selectively formed on a part of the light-receiving surface side of the photovoltaic device.

(5) The production method of a solar cell module according to the present invention is a method for producing a solar cell module in which the photovoltaic device provided with the thin-film resin layer is sealed with a resin, the production method comprising the steps of: placing the photovoltaic device on a support substrate such that the light-receiving surface side of the photovoltaic device faces up,, thereafter successively stacking a filler and a fluoroplastic film on the light-receiving surface side of the photovoltaic device, and performing heating in vacuum to effect resin sealing.

As a result, an amount of the resin necessary for filling unevenness on the photovoltaic device can be decreased. Namely, the production method of a solar cell module excellent in flame resistance can be obtained by decreasing the amount of highly combustible resin.

Since the amount of resin used can be decreased, the cost can also be reduced.

- 7 -

BRIEF DESCRIPTION OF THE DRAWINGS

Fig. 1 is a graph showing the relationship between the electrostatic withstand voltage of photovoltaic devices as samples and the percentage of samples having the photoelectric conversion efficiency decrease rate of less than 10%;

Figs. 2A and 2B are schematic cross-sectional views showing the structure of a photovoltaic device used in the solar cell module according to the present invention;

Figs. 3A and 3B are schematic cross-sectional views showing contact portion between a collector electrode and the surface of the photovoltaic device according to the present invention;

Fig. 4 is a schematic cross-sectional view showing the structure of a solar cell module according to the present invention;

Figs. 5A and 5B are schematic plan view and cross-sectional view showing the structure of a photovoltaic device used in the solar cell module according to the present invention;

Fig. 6 is a schematic cross-sectional view showing the structure of a solar cell module according to Example 1 of the present invention;

Figs. 7A and 7B are schematic plan view and cross-sectional view showing a measuring state of open voltage (Voc);

Fig. 8A is a schematic cross-sectional view showing the structure of a photovoltaic device used in a

- 8 - conventional solar cell module, and Fig. 8B is a schematic plan view showing a state of two conventional photovoltaic devices connected; and Fig. 9 is a graph showing the relationship between a voltage applied and an open-circuit voltage when photovoltaic devices were used in the solar cell module according to the present invention.

DESCRIPTION OF THE PREFERRED EMBODIMENTS

Embodiments of the present invention will be described.
(Photovoltaic device)

The photovoltaic device according to the present invention is preferably provided with a first electrode, a semiconductor layer provided on the first electrode and contributing to electric power generation, and a second electrode as a collector electrode provided on the light incidence surface side of the semiconductor layer. A transparent, electroconductive layer may also be provided between the light incidence surface side of the semiconductor layer and the collector electrode, if desired, for the purpose of preventing reflection and for the purpose of decreasing the surface resistance. The first electrode of the photovoltaic device of the present invention is provided on the back surface side of the semiconductor layer and is made of a metal by a method such as a screen printing method or a vapor deposition method. Any kind of metal can be properly selected which has a good ohmic property with the semiconductor.

When the semiconductor layer is a thin film of amorphous silicon, a flexible substrate is necessary. An insulating or electroconductive substrate is used as the flexible substrate. When the flexible substrate is an insulating substrate, the first electrode is deposited on the substrate.

A metal substrate such as stainless steel or aluminum is suitably applicable and serves as both the first electrode and the flexible substrate, but the first electrode may be a metal such as chromium, aluminum, or silver vapor-deposited on an insulating substrate such as glass, polymer resin, or ceramic. In the case of the crystal silicon solar cell, the first electrode may be formed on crystal silicon by screen printing of silver paste or the like without using a substrate.

The semiconductor layer requires a structure including a semiconductor junction such as a pn junction, a pin junction, or a Schottky junction, and a material thereof is suitably selected from IV-semiconductors containing an element of Group IV of the periodic table in crystal silicon, polycrystal silicon, thin-film polycrystal silicon, amorphous silicon or the like, II-VI semiconductors containing elements of Groups II and VI of the periodic table such as CdS or CdTe, and III-V semiconductors containing elements of Groups III and V of the periodic table such as GaAs. For the semiconductor layer, a tandem cell and a triple cell with a plurality of pin junctions or pn junctions are also suitably applicable without having to be limited to a single cell. Specific examples of the tandem cell structure are a structure in which the top layer and the bottom layer are stacked each having a pin junction comprising an i-type layer of amorphous silicon (hereinafter referred to as "a-Si") and another structure in which the top layer of a pin junction comprising an i-type layer of a-Si and the bottom layer of the pin junction comprising an i-type layer of amorphous SiGe (hereinafter referred to as "a-SiGe") are stacked. These examples also include a structure in

- 10 - which the top layer has a pin junction comprising the i-type layer of a-Si and the bottom layer has a pn junction of thin-film polycrystal. Specific examples of the triple cell structure are a structure in which the top layer and the middle layer each having a pin junction comprising the i-type layer of a-Si and the bottom layer having a pin junction comprising the i-type layer of a-SiGe are stacked, and a structure in which the top layer having a pin junction comprising the i-type layer of a-Si, the middle layer having a pin junction comprising the i-type layer of a-SiGe, and the bottom layer having a pin junction comprising the i-type layer of a-SiGe are stacked.

A material for the transparent, electroconductive layer is suitably selected from well-known materials such as ITO, $SnO_2$, or $In_2O_3$.

As shown in Figs. 5A and 5B, the collector electrode is placed on the transparent electrode layer 206, and the ends of the collector electrodes are placed through the insulating member 505. The placing method is preferably carried out such that the collector electrodes are placed in parallel at appropriate intervals so as to minimize the sum of shadow loss and loss due to electric resistance in collection of electricity. For example, if the sheet resistance of the transparent electrode layer is approximately 100 $U/mm^2$, the intervals of the collector electrodes will be preferably approximately 5 mm. If the collector electrodes are wires of a small diameter, the pitch will be set narrow; if they are wires of a large diameter, the pitch will be set wide. Such optimization can achieve the highest efficiency.

Figs. 2A and 2B are schematic cross-sectional views showing an example of a triple cell type amorphous

- 11 - photovoltaic device of the present invention. In Figs. 2A and 2B, reference numeral 200 designates a photovoltaic device, 201 a flexible substrate, 202 a first electrode, 203, 213 and 223 n-type semiconductor layers, 204, 214 and 224 i-type semiconductor layers, 205, 215 and 225 p-type semiconductor layers, 206 a transparent, electroconductive layer, 207 collector electrodes, 208 an adhesive, and 209 a positive electrode busbar. Fig. 2A is a cross-sectional view of a busbar-formed portion of this structure, and Fig. 2B is a cross-sectional view of a portion where the aforementioned collector electrodes are formed on the surface of the photovoltaic device in the electric power-generating region. The surface of the photovoltaic device in the power-generating region is covered by thin-film resin layer 230 of the present invention. Figs. 2A and 2B illustrate the triple cell structure, but the single cell having one semiconductor junction and the tandem cell having two semiconductor junctions are also included in the structures of the present invention.

(Production method of photovoltaic device)

In the production method of the photovoltaic device according to the present invention, the collector electrodes are preferably bonded onto the semiconductor layer or the transparent, electroconductive layer on the light incidence side by a bonding method with heat or pressure or with heat and pressure. The heating temperature is preferably set to be equal to or higher than the temperature at which the coating layer of a electroconductive resin softens and adheres to the surface of the photovoltaic device. The pressure is preferably set to be the pressure to induce moderate deformation of the coating layer, but must be smaller than the pressure that is too low to damage the photovoltaic device. Specifically, for example, in the case of the thin-film photovoltaic device, for example, of amorphous silicon, the preferred pressure is $0.1 kg/cm^2$ to $1.0 kg/cm^2$. The bonding method may be a method for applying the adhesive onto parts or the whole of wires to conduct bonding, or a method for forming patterns of the adhesive in a linear shape or in a desired shape of a dot on the surface of the photovoltaic device by screen printing or the like and then placing the wires to conduct bonding. When the coating layer is of the hot melt type, it should be desirably softened by heat to bond the wires to the solar cell, and an appropriate pressure may also be applied upon bonding. When the coating layer is thermoplastic, it is softened by heating; when it is a thermosetting resin, it is also permitted to dry the solvent without curing the resin upon application to the wires or upon printing on the solar cell substrate and then cure the resin by heating upon bonding.

Figs. 3A and 3B are schematic cross-sectional views showing a state in which a metal wire is bonded to the surface of the photovoltaic device. In Figs. 3A and 3B, numeral 300 denotes a collector electrode, 301 a photovoltaic device, 302 a metal wire, and 303 an electroconductive adhesive. Numeral 310 designates a thin-film resin layer according to the present invention. Fig. 3A is a cross-sectional view showing a state in which the metal wire coated with the electroconductive adhesive is bonded to the surface of the photovoltaic device. Fig. 3B is a cross-sectional view showing a state in which the metal wire is placed and the conductive adhesive is partly placed to bond the wire to the surface of the photovoltaic device.

(Thin-film resin layer)

The thin-film resin layer 230 according to the present invention is provided at least on the electric power-generating region on the light-receiving surface side of the photovoltaic device and has a function to protect the photovoltaic device from the static electricity due to the charge on the worker or neighboring equipment. The thin-film resin layer permits the photovoltaic device to have the electrostatic withstand voltage of not less than 5 kV, and it can protect the photovoltaic device in the normal lamination work. The inventors found that, conversely, when the electrostatic withstand voltage was less than 5 kV, the photoelectric conversion efficiency was greatly lowered after the lamination work.

The electrostatic withstand voltage of the photovoltaic device depends upon the thickness of the thin-film resin layer. The average thickness thereof is desirably not less than 5 $\mu$m. As shown in Figs. 3A and 3B, the resin of thin-film resin layer 310 is likely to cohere near the electrode 300. On the other hand, the thin-film resin layer 310 is very thin or the resin is absent, at the top of electrode 300. However, when the average thickness is not less than 5 $\mu$m, the electrostatic withstand voltage of the photovoltaic device can be kept not less than 5 kV, which was found by the inventors. This is probably because the electrode 300 is a good conductor and does not affect the semiconductor layer therebelow even if the thin-film resin layer is very thin. Therefore, according to the present invention, the thin-film resin layer does not have to be thicker than necessary in order to cover the top part of the collector electrode. Too large thicknesses will lower the adhesion with a transparent, organic polymer resin described hereinafter. In addition, the thin-film resin layer is required to have high moisture resistance and low moisture permeability in order to prevent water from intruding through the surface of the solar cell module, and to be transparent. The moisture permeability is desired to be preferably 0.01 to 20 g/m$^2$.day at 40°C and 90 %RH. If the moisture permeability is lower than 0.01 g/m$^2$.day, crystallinity will be too high to provide the solar cell module produced with flexibility. If the moisture permeability is higher than 20 g/m$^2$day, the effect as an antimoisture film will not be expected at all. In order to restrain decrease in quantity of light reaching the photovoltaic device as much as possible, the light transmittance of the thin-film resin layer is desirably not less than 80 %, more desirably not less than 90 % in the visible light wavelength region of 400 nm to 800 nm. In order to facilitate incidence of light from the atmosphere, the index of refraction is preferably 1.1 to 2.0, more preferably 1.2 to 1.6.

Specific materials for the thin-film resin are resins, the main component of which is an acrylic resin, a silicone resin, or a fluororesin.

As different curing type ones, a two-part type paint such as the moisture curing type or the isocyanate-curing type and a one-part type paint using blocking isocyanate can be used. When the two-part type paint is used, the resin and a curing agent must be mixed immediately before application. The apparatus becomes complex and the collected resin which has been used cannot be reused, thus posing the problem of high cost. Therefore, a preferred material is a one-part type paint made of a resin obtained by heat-crosslinking an acrylic resin and an inorganic polymer with blocking isocyanate.

The dissociation temperature of blocking isocyanate as the block agent for crosslinking the acrylic resin and the inorganic polymer is preferably in the range of 80°C to 220°C. If it is below 80°C, the pot life of the resin itself will shorten to thereby degrade storage performance; if it is over 220°C, the component such as the acrylic resin will thermally deteriorate or yellow and the heat given upon curing will possibly adversely affect the semiconductor layer. Since at least a part of the block agent remains in the paint film after thermal dissociation, it should be selected from those not coloring and not reacting with the coating composition even if it remains in the paint film. For provision of the adhesive property, a silane type, titanium type, or aluminum type coupling agent may be added by 0.01 % to 10 % to the resin. Preferably, the silane type coupling agent is added by 0.05 % to 8 %.

Specific paint film (i.e., thin-film resin layer) forming methods are methods for applying the paint onto the photovoltaic device by, for example, spray coating, spin coating, curtain coating, or film coating. The film coating method is preferred. Typically, after the drying of solvent, the paint film is heated at 200°C for 10 minutes to harden.

(Film coating)

The above film coating in the present invention is a method for delivering the paint in a film shape from a gun while sending air to the gun such that the paint is discharged in a film shape. This method allows partial coating to an object to be coated by adjusting the width of the film. During the coating, the object can be moved while fixing the gun; or the gun can be moved while fixing the object. A plurality of guns may be used in parallel for coating the paint in a large area.

(Solar cell module)

The structure of the covering members used for covering the photovoltaic device according to the present invention will be described in detail. A solar cell module of the present invention is composed, as shown in Fig. 4, of photovoltaic device 401, thin-film resin layer 402, surface protecting and reinforcing material 403, surface sealing material 404, surface member 405, back sealing material 406, back insulating material 407, and back member 408. In order to cover the busbars 209 of photovoltaic device shown in Fig. 2A, decorative tape 409 is laid thereon.

The coating members located on the upper (or front) surface side of photovoltaic device 401 will be described below in detail.

(Decorative tape)

The decorative tape 409 is provided on the positive electrode busbars 504. In addition, it is also provided on the solder for connecting these photovoltaic devices in series. These positive electrode busbars are convex on the substrate. Therefore, the thickness of the covering member is thin on the positive electrode busbars and it is thus very weak against external impact. If the metal member of the busbar contacts the organic polymer resin and if it is further exposed to light, deterioration of the resin on the metal member will be accelerated or decomposition products of the resin will corrode the metal member. For addressing these problems, a hard film of polyethylene terephthalate, nylon, polycarbonate, or the like is used as the decorative tape. Further, in order to interrupt the light, a film desired to use is a black or dark-brown film, specifically, a film having the overall ray transmittance of not more than 5 % in the wavelength range of 300 nm to 800 nm. An organic polymer resin layer of EVA, EEA, or the like is desired to be provided under the film in order to cover the metal member under the film.

(Surface protecting and reinforcing material 403)

The surface protecting and reinforcing material 403 is desirably smaller than the back member 408 so as not to exist at the edges of the solar cell module. If the surface protecting and reinforcing material 403 is equal to or larger than the back member 408 to be extended to the edges of the module, water would intrude thereinto from the outside to promote deterioration of this covering material and to cause exfoliation. The intrusion of water would degrade the electrical insulation of the photovoltaic device inside from the outside. This is because the adhesive force is weak between the surface protecting and reinforcing material 403 and the surface sealing material 404 and therefore water intrudes along the surface of the surface protecting and reinforcing material 403 through the interface between them as the flow path. The adhesive force between the surface protecting and reinforcing material 403 and the surface sealing material 404 is drastically enhanced by subjecting either one of them or both to a surface treatment such as a silane coupling treatment. There is, however, a limit to the level of enhancement, and the coupling agent will deteriorate after long-term outdoor exposure or after a temperature-humidity cycle test, thereby degrading the adhesive force.

The surface protecting and reinforcing material 403 used in the present invention is necessary for achieving flame resistance while assuring scratch resistance with a decreased amount of a filler. Further, in the case of a large solar cell module of the roof or wall installation type, it is very effective for sufficiently degassing the inside of module upon the lamination. The nonwoven fabric of glass fiber is normally used as the surface protecting and reinforcing material used herein.

Further, the surface of the surface protecting and reinforcing material is desirably processed by the silane coupling treatment in order to enhance the adhesion between the surface protecting and reinforcing material 403 and the surface sealing material 404.

(Surface sealing material)

The surface sealing material 404 is necessary for coating the unevenness of photovoltaic device 401 with the resin, protecting the device from the severe external environments including temperature change, humidity, and impact, and assuring bonding between the surface film and the device. Therefore, demanded are weather resistance, adhesiveness, filling ability, heat resistance, cold resistance, and impact resistance. Examples of resins satisfying these demands include polyolefin-based resins such as ethylene-vinyl acetate copolymer (EVA), ethylene-methyl acrylate copolymer (EMA), ethylene-ethyl acrylate copolymer (EEA) and polyvinyl butyral, and urethane resins, silicone resins, fluororesins, and so on. Among them, EVA is often used by choice, because it has well-balanced physical properties for applications to solar cells.

However, it has a low heat distortion temperature in the original form and readily exhibits distortion or creep under use at high temperatures. Therefore, it is desirably crosslinked to enhance heat resistance. EVA

- 19 - is normally crosslinked with an organic peroxide. The crosslinking with the organic peroxide takes place in such a way that free radicals produced from the organic peroxide withdraw hydrogen or halogen atoms from the resin to form C-C bonds. The conventional methods for activating the organic peroxide are thermal decomposition, redox decomposition, and ion decomposition. In general, thermal decomposition is often used by choice. Specific examples of the organic peroxide are hydroperoxide, dialkyl (allyl) peroxide, diacyl peroxide, peroxy ketal, peroxy ester, peroxy carbonate, and ketone peroxide. An amount of addition of the organic peroxide is 0.5 to 5 parts by weight with respect to 100 parts of the sealing resin.

The above organic peroxide is combined with the surface sealing material, and the crosslinking and thermal compression bonding can be effected under hot pressing in vacuum. The heating temperature and time can be determined depending upon the thermal decomposition temperature characteristics of each organic peroxide. In general, hot pressing is terminated at the temperature and time where thermal decomposition takes place 90 %, more preferably 95 % or more. The crosslinking of the sealant resin can be checked by measuring gel fractions, and the crosslinking to achieve the gel fraction of 70 wt% or more is desired in order to prevent distortion of the sealant resin at high temperatures.

In order to efficiently undergo the above crosslinking reaction, triallyl isocyanurate (TAIC) called a crosslinking assistant can also be used. In general, an amount of addition of the crosslinking assistant is 1 to 5 parts by weight with respect to 100 parts by weight of the sealant resin.

The surface sealing material used in the present
invention is excellent in weather resistance, but an
ultraviolet ray absorber may also be added thereto for
further improving weather resistance or for protecting
the layers below the surface sealing material. The
ultraviolet ray absorber is selected from well-known
compounds, and use of a low-volatile ultraviolet
absorber is preferred, taking into account the
operating environments of solar cell modules. Specific
examples are various organic compounds including
salicylic, acid-based compounds, benzophenone-based
compounds, benzotriazole-based compounds, and
cyanoacrylate-based compounds.

If a light stabilizer is also added together with the
ultraviolet absorber, the sealant will become more
stable to the light. Typical light stabilizers are
hindered-amine-based light stabilizers. The hindered-
amine-based light stabilizers do not absorb ultraviolet
rays, unlike the ultraviolet ray absorbers, but they
demonstrate a prominent synergistic effect when used
together with the ultraviolet absorber. Of course,
there are light stabilizers other than the
hindered-amine-based light stabilizers, but most of
them are colored and thus not preferable for the
sealing material in the present invention.

Adding amounts of the above ultraviolet absorber and
light stabilizer are desirably 0.1 to 1.0 % by weight
and 0.05 to 1.0 % by weight, respectively, with respect
to the sealing resin.

Further, it is also allowed to add an antioxidant in
order to improve heat resistance and thermal
workability. The antioxidant are of the monophenol
type, the bisphenol type, the polymer phenol type, the
sulfur type, and the phosphoric acid type. An adding

- 21 - amount of the antioxidant is preferably 0.05 to 1.0 % by weight of a filler resin.

If the solar cell module is assumed to be used under severe circumstances, the adhesive strength should be preferably increased between the filler and the photovoltaic device or the surface resin film. Further, when an inorganic compound of fiber is used as the surface covering material, the adhesive strength therewith needs to be enhanced. For that purpose, the silane coupling treatment is effective. Specific examples of silane coupling agents are vinyltrichlorosilane, vinyltris(β-methoxyethoxy) silane, vinyltriethoxysilane, vinyltrimethoxysilane, methacryloxypropyltrimethoxysilane, β-(3,4-epoxycyclohexyl) ethyltrimethoxysilane, γ-glycidoxypropylmethyldiethoxysilane, N-β (aminoethyl) γ-aminopropyltrimethoxysilane, N-β (aminoethyl) γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, and so on.

An adding amount of the silane coupling agent is preferably 0.1 to 3 parts by weight, more preferably 0.25 to 1 part by weight, with respect to 100 parts by weight of the sealing resin.

On the other hand, the surface sealing material must be transparent in order to restrain the decrease in the quantity of light reaching the photovoltaic device as much as possible. Specifically, the light transmittance of the surface sealing material is desirably 80 % or more, more desirably 90 % or more in the visible light wavelength region of 400 nm to 800 nm. For facilitating incidence of light from the atmosphere,

- 22 - the index of refraction at 25°C is preferably 1.1 to 2.0, more preferably 1.1 to 1.6.

There are commercially available EVA sheets for solar cells obtained by molding EVA mixed with the above additives in a sheet shape. The solar cell module can be produced readily by interposing these sheets between the photovoltaic device and a surface member and then hot-pressing them.

(Surface member 405)

Since the surface member 405 used in the present invention is located in the outermost layer of the solar cell module, it needs to exhibit long-term reliability in outdoor exposure of the solar cell module, including transparency, weather resistance, pollution resistance, and mechanical strength. Materials suitably applicable to the present invention are white sheet tempered glass, fluororesin film, acrylic resin film, and so on. Since the white sheet tempered glass has high transparency and high resistance against impact and is hard to break, it is widely used as the surface member of solar cell module. However, recent modules are often required to have light weight and flexibility. In such cases, resin films are used as the surface member. Among them, the fluororesin film is often used by choice because of its excellent weather resistance and pollution resistance. Specific examples of the fluororesin are polyvinylidene fluoride resin, polyvinyl fluoride resin, tetrafluoroethylene-ethylene copolymer, and so on. The polyvinylidene fluoride resin is excellent in terms of weather resistance, but the tetrafluoroethylene-ethylene copolymer is excellent in transparency and compatibility of weather resistance and mechanical strength. The thickness of the surface member needs to be thick enough to secure the mechanical strength, but
should not be too thick in terms of the cost.
Specifically, the thickness is preferably 20 to 200 μm,
more preferably 30 to 100 μm.

In order to improve the adhesion to the sealing
material, one surface of the resin film is desirably
subjected to a surface treatment such as a corona
treatment, a plasma treatment, an ozone treatment, UV
irradiation, electron beam irradiation, or a flame
treatment. Among them, the corona discharge treatment
is suitably used, because it can greatly enhance the
adhesive strength by use of a relatively simple
apparatus with a high treatment rate.

The covering members located on the back (or lower)
surface side of photovoltaic device 401 will be
described below in detail.

(Back sealing material 406)

The back sealing material 406 used on the non-light-
receiving surface side may be the same as the surface
sealing material. The desired performance for the back
sealing material is that the adhesive strength of the
photovoltaic device with the back insulating material
and the back member is not lowered under light or heat,
in the outdoor operation, in the temperature-humidity
cycle test, or the like, rather than that it is not
colored under light or heat or the like, demanded on
the light-receiving surface side.

For example, when the back member is made from a
painted, galvanized steel sheet having a surface
excellent in weather resistance and rust prevention .
when coated with a resin, it is weak particularly in
the adhesive strength, thus posing a serious problem as to the long-term reliability. As the resin for the steel, the following resins are used: polyolefin-based resins such as the ethylene-vinyl acetate copolymer (EVA), the ethylene-methyl acrylate copolymer (EMA), the ethylene-ethyl acrylate copolymer (EEA), polyethylene, or the butyral resin, urethane resins, silicone resins or flexible epoxy adhesives. For enhancement of the adhesive strength, these resins for coating the steel are further coated or bonded with the back sealing material. Preferred back sealing materials are polyolefin-based resins such as the ethylene-vinyl acetate copolymer (EVA), the ethylene-methyl acrylate copolymer (EMA), the ethylene-ethyl acrylate copolymer (EEA) and the butyral resin, urethane resins, silicone resins, or the like, which are mixed with a tackiness providing resin, i.e., a tackifier, a coumarone-indene resin, a phenol-formaldehyde resin, a polypentene resin, a xylene-formaldehyde resin, polybutene, rosin, a rosin pentaerythritol ester, a rosin glycerine ester, hydrogenated rosin, a hydrogenated rosin methyl ester, a hydrogenated rosin pentaerythritol ester, a hydrogenated rosin triethylene glycol ester, a polymerized rosin ester, an aliphatic petroleum resin, an alicyclic petroleum resin, a pentadiene resin, α-pinene, β-pinene, a dipentene-based resin, a terpenephenol resin, or the like. Further, for simplification, an integrally laminated material in which the adhesive layer of the back sealing material as described above is preliminarily laminated on both sides of the back insulating member is used.

(Back insulating member)

The back insulating member 407 is necessary for maintaining the electrical insulation of the electroconductive substrate of photovoltaic device 401 from the outside. A preferred material is one that can assure sufficient electrical insulation to the , electroconductive substrate, that is excellent in long-term durability and resistant to thermal expansion and thermal contraction, and that also has flexibility. The films suitably applicable are of nylon or polyethylene terephthalate.

(Back member)

The back member 408 is preferably larger than the photovoltaic device 401. When the solar cell module is installed on the roof or the wall and the like, or when it is a solar cell, module integrated with a roof material, the module is preferably used after being processed by folding. The folding enables the module to be installed without a need for attachment of a frame or the like, and the solar cell module can be produced and installed more easily and cheaply by reduction of raw-material costs necessary for the frame and accessories and by decrease of the step of attachment of a frame. For this purpose, the back member 408 is preferably larger than the photovoltaic device, thereby enabling complex working without exerting stress on the photovoltaic device 401.

The back member 408 is necessary for increasing the mechanical strength of the solar cell module or for preventing distortion or warp due to temperature change. Specifically, preferred materials for the back member are a steel sheet, a plastic sheet, and an FRP (glass fiber reinforced plastic) sheet. Specifically, the back member of a steel sheet is excellent in workability such as folding and can be brought to the commercial stage without employing attachment of a frame, as used heretofore. The solar cell module can be used as incorporated with a roof or wall material,

- 26 - which is also very effective in terms of the cost reduction and simplification of production steps. Further, when a steel sheet coated with a resin is used as a reinforcing material, the solar cell module can be obtained with high reliability and with excellent weather resistance and rust prevention.

Now, described referring to Fig. 4 is a method for forming the solar cell module, using the above-stated photovoltaic device, surface protecting and reinforcing material, surface sealing material, surface member, back sealing material, back insulating member, and back member.

The light-receiving surface of photovoltaic device 401 is normally coated by a method for producing the surface sealing material 404 in the sheet shape and for hot-pressing it on the top and bottom surfaces of the photovoltaic device 401. The coating structure of the solar cell module is as shown in Fig. 4. Specifically, the photovoltaic device 401, thin-film resin layer 402, surface protecting and reinforcing material 403, surface sealing Material 404, surface member 405, back sealing material 406, back insulating member 407, back sealing material 406, and back member 408 are stacked in the order of Fig. 4 or in the reverse order and hot-pressed to form the module. The decorative tape 409 is laid on the positive electrode busbars 505. However, the layers are stacked preferably in the order of Fig. 4 such that the surface member 405 is stacked in an upper position, for coating the photovoltaic device with a small amount of filler.

The heating temperature and heating time upon hot-press bonding are determined to be those at which the crosslinking reaction takes place sufficiently.

- 27 -

The method of hot-press bonding can be selected from a variety of conventional methods including the double vacuum evacuation method, the single vacuum evacuation method, and roll lamination. Among them, the heat compression bonding by the single vacuum evacuation method is a preferred method, because the solar cell module can be produced easily by a cheap apparatus.

Examples of the present invention will be described in detail by reference to the drawings, but it is noted that the present invention is by no means intended to be limited to these examples.

(Example 1)

In the present example, the thin-film resin layer was formed on the electric power-generating region of the photovoltaic device forming the solar cell module shown in Fig. 6. After the thin-film resin layer formed on the semiconductor layer was charged from the worker and after the tweezers were dropped on the thin-film resin layer, whether the semiconductor layer was damaged or not was checked by measuring the shunt resistance thereof. The thin-film resin layer was an acrylic urethane resin film. Thicknesses of the thin-film resin layer were changed with necessity in order to change the electrostatic withstand voltage of photovoltaic device.

The method for forming the photovoltaic device will be described according to the production procedures thereof.

(1) A carbon paste was prepared as follows in order to form the conductive adhesive 303 for forming the coating layer of collector electrode, as shown in Figs. 3A and 3B.

(i) A mixed solvent of 2.5 g of ethyl acetate and 2.5 g of IPA as a solvent was charged into a shake bottle, for dispersion.

(ii) 22.0 g of a urethane resin to become the main component was added into the shake bottle, and the mixture was fully stirred by ball mill.

(iii) 1.1 g of block isocyanate as a curing agent and 10 g of glass beads for dispersion were added to the above solution.

(iv) 2.5 g of carbon black having the mean primary particle size of electroconductive particles of 0.05 μm was added to the above solution.

(2) After the materials were charged into the shake bottle as in the above (1), they were dispersed for 10 hours by a paint shaker. After that, the glass beads for-dispersion were taken out of the electroconductive adhesive thus produced. The mean particle size of the electroconductive adhesive was measured and was approximately 1 μm. The same result was obtained by use of a bead mill instead of the paint shaker.

(3) The electroconductive adhesive obtained in the above (2) was cured under the standard curing conditions of the curing agent (160°C, 30 minutes), and then the volume resistivity thereof was measured (10 Ωcm), thus confirming that the resistance was sufficiently low.

(4) Using a wire coating machine not shown in the drawings, the electroconductive adhesive 303 was applied as a coating layer onto wires and was dried, thus forming the collector electrodes. The application rate was 40 m/min, the residence time was 2 sec, and

- 29 - the temperature of the drying furnace was 120°C. Five separate coatings were conducted. The pore diameter of dies for enamel coat used was 150 μm to 200 μm. The conductive adhesive 303 coating the wires 302 existed in an uncured state while the solvent volatilized. Layer thicknesses of the electroconductive adhesive 303 were 20 μm on average and variations in the thicknesses were within ±1.5 μm in the results of coating 100 m long.

(5) The photovoltaic device shown in Figs. 2A and 2B was produced using the collector electrodes 300 produced in the above step of (4). The flexible substrate 201 was a substrate of SUS 430BA. Using a DC sputtering apparatus not shown in the drawings, layers of Ag 400 nm thick and ZnO 400 nm thick as the first electrode 202 were formed on the flexible substrate 201 which was degreased and cleaned.

(6) Semiconductor layers of the triple cell type described below were formed on the first electrode 202, using a microwave plasma enhanced CVD apparatus not shown in the drawings.

(i) The bottom layer was formed by depositing the n-type layer 203, i-type layer 204, and p-type layer 205 in this order on the first electrode 202. At this time, the i-type layer 204 was of a-SiGe.

(ii) The n-type layer 213, i-type layer 214, and p-type layer 215 were deposited in the named order on the bottom layer, thereby forming the middle layer. The i-type layer 214 was also of a-SiGe as in the bottom layer.

(iii) The n-type layer 223, i-type layer 224, and p-type layer 225 were deposited in the named order on the

- 30 - middle layer, thereby forming the top layer. The i-type layer was of a-Si.

(7) On the light incidence side of the semiconductor layers, i.e., on the top layer, a transparent, electroconductive layer of ITO was formed as the transparent electrode 206, using a vapor deposition apparatus of resistance heating not shown in the drawings. Through the above steps, the photovoltaic device 200 was produced.

(8) From the photovoltaic device 200 obtained in the step (7), unnecessary parts of the transparent, electroconductive layer were removed with an etching paste, the main component of which was ferric chloride, by a commercially available printing machine so that the size of the photovoltaic device (cell) was 30 cm x 30 cm and the effective area was 900 $cm^2$.

(9) Negative electrode busbars of copper foil 100 $\mu$m thick were placed by spot welding on parts of the non-light-receiving surface side of the photovoltaic device obtained in the step (8).

(10) As shown in Figs. 5A and 5B, an insulating tape was bonded to the non-electric power-generating region on the light-receiving surface side of the photovoltaic device 501 obtained in the step (9), and the collector electrodes 503 were arranged at intervals of 5.5 mm to be fixed on the adhesive-material.

(11) The positive electrode busbars 504 were made of copper foil obtained by coating soft copper with silver plate, and the positive electrode busbars 504 were formed on the, collector electrodes 503 and adhesive material 505.

- 31 -

(12) For bonding the collector electrodes 503 to the cell surface of photovoltaic device, they were hot-pressed by a heating machine not shown in the drawings. The heating conditions were 200°C, 1 min, and a pressure of 1 kg/cm$^2$.

(13) For bonding the collector electrodes 503 to the positive busbars 504, they were heated and compressed using the heating machine not illustrated. The heating conditions were 200°C, 15 sec, and a pressure of 5 kg/cm$^°$.

(14) On the electric power-generating region of the photovoltaic device obtained through the steps up to step (13), an acrylic urethane paint was applied to the light-receiving surface side of the photovoltaic device by airless spray coating, and after drying the solvent, it was heated at 200°C for 10 minutes to harden, thereby providing the, thin-film resin layer 510.

(i) By the above method, 100 samples were produced for each of thicknesses 0.5, 1, 5, 10, 20, and 30 μm of the thin-film resin layer 510. The photoelectric conversion efficiency was measured for each sample under 700 Lux. After that, these samples were subjected to the works "series connection" and "module formation" as described below, and they were evaluated as to the decrease rate of the photoelectric conversion efficiency after the work.

(Series connection]

Next described is a method for producing a photovoltaic device array by connecting photovoltaic devices in series after completion of the above evaluation.

The devices were aligned and thereafter the

- 32 - adjacent devices were connected by soldering the positive electrode busbars of one device to the negative electrode busbars of another device. By this, the two photovoltaic devices were connected in series. On this occasion, copper tabs connected to the output terminals of the devices at the outside ends were routed to the bottom surface so that the output was able to be taken out through holes of the back covering layer as described hereinafter. In this way, the photovoltaic devices were connected in series in units of two each on a non-electroconductive table mat at a temperature of 22°C and a moisture of 35%RH.

[Module formation]

Next described referring to Fig. 6 is a method for producing the solar cell module by coating the above photovoltaic device array.

In Fig. 6, numeral 601 designates a photovoltaic device array, 602 a surface protecting and reinforcing material (80 g/$M^2$), 603 a surface sealing material, 604 a surface member, 605 a back covering material, 607 a back member, 608 a decorative tape, and 609 a transparent, thin-film resin layer. The solar cell module was produced by stacking these layers.

(Surface protecting and reinforcing member)

Prepared as the surface reinforcing member (80 g/$M^2$) 602 was a nonwoven fabric of glass fiber containing an acrylic resin adhesive of 4.0%, the glass fiber nonwoven fabric having the basis weight of 80 g/$M^2$, the thickness of 400 μm, and the fiber diameter of 10 μm.

(Surface sealing material)

- 33 -

The surface sealing material 603 was a sheet 460 μm
thick which was made from a mixture containing 100,
parts by weight of ethylene-vinyl acetate (vinyl
acetate 33% by weight, the melt flow rate 30) as a
filler, 1.5 parts by weight of 2, 5-dimethyl-2, 5-bis
(t-butylperoxy) hexane as a crosslinking agent, 0.3
part by weight of 2-hydroxy-4-n-octoxybenzophenone as a
UV absorber, 0.2 part by weight of tris (mono-
nonylphenyl) phosphite as an antioxidant, and 0.1 part
by weight of (2,2,6,6-tetramethyl-4-piperidyl) cevacate
as a light stabilizer.

(Surface member)

The surface member 604 was a non-oriented ethylene-
tetrafluoroethylene film (50 μm thick). The surface of
the surface member to be bonded to the surface sealing
material 603 was preliminarily subjected to the plasma
treatment.

(Back covering material film)

The insulating film 605 as the back covering material
film was an integral lamination of the back sealing
material and a back insulating member. The back
sealing material was the ethylene-ethyl acrylate
copolymer (EEA, 200 μm thick) and polyethylene (PE)
resin (25 μm thick), and the back insulating member was
a biaxially oriented polyethylene terephthalate film
(PET, 50 μm thick). These were integrally stacked in
the order of EEA/PE/PET/PE/EEA to obtain the integral
lamination film of the total thickness of 500 μm.

(Back member)

Prepared as the back member 607 was a steel sheet
obtained by coating one surface of a galvanized steel sheet (an aluminum-zinc alloy plated steel sheet
integrally containing aluminum 55%, zinc 43.4%, and,
silicon 1.6%) with a polyester-based paint and by
coating the other surface thereof with a polyester-
based paint to which glass fibers were added. The
thickness of the steel sheet was 400 $\mu$m.

(Decorative tape)

Prepared as the decorative tape 608 was a film of
EVA/PET/EVA in which the ethylene-vinyl acetate
copolymer (460 $\mu$m thick) was integrally laid on the
both sides of a polyethylene terephthalate (PET) film
(50 $\mu$m thick, color: black).

(Dimensions of the respective components)

The surface protecting and reinforcing material 602 was
prepared which had 5 mm larger each side than the
photovoltaic device. The back covering material 605
was prepared which had 15 mm larger each side than the
photovoltaic device. The back member 607 was
prepared which had 80 mm larger each side than the
photovoltaic device. The surface sealing material 603
and surface member film 604 were prepared which had 90
mm larger each side than the photovoltaic device. The
decorative tape 608 was prepared which had the width of
20 mm and the same length as that of the photovoltaic
device.

(Lamination step)

The lamination step as described below was carried
out at room temperature of 20° and humidity of 35 %RH.

(1) The components were stacked in the order of surface
member film 604 / surface sealing material 603 / surface protecting and reinforcing material (80 g/M$^2$) 602 / photovoltaic device 601 / back covering material 605 / back member 607 to obtain a laminate body. The decorative tape 608 was laid on the collector electrodes. During the stacking step, for adjusting alignment, several re-stacking and shifting operations were performed of the surface member 604, surface sealing material 603, and surface protecting and reinforcing material (80 g/M$^2$) 602 laid on the photovoltaic device.

(2) This laminate body was placed on a plate of a laminate device of the single vacuum chamber system with the surface member (ETFE film) 604 facing up, and a silicone rubber sheet was laid thereon.

(3) Then a vacuum pump was actuated to evacuate through a perforated pipe, thereby attaching the rubber to the plate. The evacuation rate at this time was 76 Torr/sec, and the evacuation was continued in the inside vacuum degree of 5 Torr for 30 minutes.

(4) This plate was put into a hot air oven preliminarily set in an atmosphere of 150°C. After the temperature of the plate was increased to 150°C, the temperature was maintained for 30 minutes to undergo melting and crosslinking reaction of EVA used as the surface sealing material.

(5) After that, the plate was taken out of the oven, and air was sent thereto by a fan to cool the plate down to approximately 40°C. Then the evacuation was stopped and the solar cell module was taken out.

(6) After being taken out, the covering material larger than the back member was cut at the edges of the back member and, further, the longitudinal edges of the back material were folded. The output terminals were
preliminarily routed to the back surface of the
photovoltaic device, so that the output could be taken
out through the terminal outlets preliminarily formed
in the galvanized steel sheet, after the lamination.

(Evaluation)

(1) Table 1 shows measurement results of photoelectric
conversion efficiency of the samples described in the
above (14), (1) and shows the relationship between the
average thickness of the thin-film resin layer and the
decrease rate of photoelectric conversion efficiency.
In Table 1, each O mark indicates a case wherein
the decrease rates of all samples were less than 10%,
each Δ mark a case wherein 95% or more of all samples
showed the decrease rates of less than 10%, and each X
mark a case wherein samples of less than 95% of all
samples showed the decrease rates of less than 10%.

TABLE 1

| Thickness ($\mu$m) | 0.5 | 1.0 | 5.0 | 10.0 | 20.0 | 30.0 |
|---|---|---|---|---|---|---|
| Result | X | X | Δ | O | O | O |

From Table 1, it is seen that the decrease rates were
improved when the average thickness of the thin-film
resin layer was not less than 5 $\mu$m and, particularly,
that the effect was outstanding when the average
thickness was not less than 10 $\mu$m.

(2) Samples of photovoltaic device were prepared in
thicknesses of the thin-film resin layer of 0.5, 1, 5,
10, 20, and 30 $\mu$m, and open voltage (Voc) thereof under
700 Lux was measured while applying the voltage of 1 kV
through probe 705 onto the thin-film resin layer 704 provided in the electric power-generating region of photovoltaic device 701, as shown in Figs. 7A and 7B. After that, the applied voltage was increased in 1kV steps, and the electrostatic withstand voltage was defined as an applied voltage at the open voltage lowered by 10% of the initial Voc value.

Table 2 shows electrostatic withstand voltages of the respective samples. Fig. 1 shows the relationship between the electrostatic withstand voltage and the percentage of samples with the decrease rate of photoelectric conversion efficiency being less than 10%, obtained from Table 1 and Table 2. It is seen that the samples with the electrostatic withstand voltage being not less than 5 kV show no reduction or very little reduction in the conversion efficiency after the lamination work.

TABLE 2

| Thickness ($\mu$m) | 0.5 | 1.0 | 5.0 | 10.0 | 20.0 | 30.0 |
|---|---|---|---|---|---|---|
| Static withstand voltage (kV) | 3.0 | 4.0 | 5.0 | 8.0 | 20.0 | 22.0 |

Fig. 9 shows the relationship between applied voltage and open voltage (Voc) where the thin-film resin layer having the average thickness of 20 $\mu$m was provided. The figure also shows a case without the thin-film resin layer as a comparative example.

It was verified that the electrostatic withstand voltage was increased with increase in the thickness of the thin-film resin layer and, particularly, that the high electrostatic withstand voltages of 20 kV or more were obtained when the thickness was 20 $\mu$m or more.

- 38 -

Based on the above knowledge, initial performance evaluation described below was conducted for the samples with the thin-film resin layer having the average thickness of 20, 30, 40, 50, 60, 80, or 100 μm by using the samples prepared in above step (14).

Evaluation (a): For the samples, voltage-current characteristics were measured, and the shunt resistance was determined from the slope near the origin. They showed good values of 200 k$\Omega$cm$^2$ to 500 k$\Omega$cm$^2$. In the individual samples, the decrease of shunt resistance and open voltage (Voc) was less than 10% even after application of the voltage of 5 kV.

Evaluation (b): The solar cell performance was measured using an artificial sunlight source (hereinafter referred to as "simulator") under a global sunlight spectrum of AM 1.5 and the light volume of 100 mW/cm$^2$ to obtain the photoelectric conversion efficiency. The conversion efficiency was 8.5 % 0.02 %, thus exhibiting the good performance with little variation.

The following evaluations were carried out for the solar cell modules; after completion of the above lamination step.

Evaluation (c): The initial appearance was observed. The unevenness on the solar cell device was also filled fully with the filler, thus obtaining the good result.

Evaluation (d): The samples were put in a thermo-hygrostat, the temperature and humidity of which were controllable. The samples were stored under the environment of temperature 85°C and relative humidity 85 %RH, and the bias voltage of 0.7 V was applied thereto in the forward bias direction to observe change in the shunt resistance. The reduction of the photoelectric conversion efficiency was 2 % on average from the initial conversion efficiency, thus indicating no significant deterioration.

Evaluation (e): These samples were subjected to the temperature-humidity cycle test of 1000 hours. After the test, the appearance of the samples was observed. Exfoliation was observed between the thin-film resin layer and the transparent, organic polymer resin in the samples having the thickness over 60 μm.

From the above-stated results, it became apparent that the solar cell modules with good static withstand voltage characteristics were obtained by the arrangement wherein the thin-film resin layer having the average thickness of 20 μm to 60 μm was provided on at least the electric power-generating region on the light-receiving surface side of photovoltaic device.

(Example 2)

The present example is different from Example 1 in that the layers were successively stacked with the light-receiving surface of photovoltaic device facing down upon the lamination of photovoltaic device. The thin-film resin layer used was the acrylic urethane resin film (the average thickness of which was 20 to 30 μm).

The solar cell module was produced in the same manner as in Example 1 except for the above point.

The same evaluations as in Example 1 were conducted and good results were obtained; the initial shunt resistance was 300 to 400 $k\Omega cm^2$; the initial conversion efficiency was 8.3 ± 0.15 %; the shunt resistance and

- 40 - conversion efficiency after the series connection both showed only the decrease of not more than 2 %; the shunt resistance and conversion efficiency after the lamination also showed only the decrease of not more than 2 % with respect to the initial shunt resistance and conversion efficiency.

With the solar cell module of the present example, however, the appearance thereof after the lamination was such that the unevenness on the photovoltaic device was not filled sufficiently.

(Example 3)

The present example is different from Example 1 in that the lamination was conducted before the series connection of photovoltaic devices, and the photovoltaic devices after the lamination were connected in series. The thin-film resin layer used was the acrylic urethane resin film (the average thickness of which was 20 to 30 $\mu$m).

The solar cell module was produced in the same manner as in Example 1 except for the above.

The same evaluations as in Example 1 were conducted and good results were obtained; the initial shunt resistance was 200 to 600 k$\Omega$cm$^2$; the conversion efficiency was 8.2 ± 0.08 %; the shunt resistance and conversion efficiency after the lamination showed only the decrease of not more than 1 % as compared with the initial shunt resistance and conversion efficiency.

With the solar cell module of the present example, however, the percentage of the non-electric power-generating region on the light-receiving surface side

- 41 - increased, so that the electric power generated per area was smaller than in Examples 1 and 2.

(Comparative Example 1)

This comparative example is different from Example 1 in that no thin-film resin layer was formed.

The solar cell module was produced in the same manner as in Example 1 except for the above.

The same evaluations as in Example 1 were conducted and good results were obtained as to the initial characteristics of the photovoltaic device. However, after the series connection, Voc under 200 Lux showed the decrease of 40 to 60 % and the shunt resistance showed the decrease of 50 to 90 %. The conversion efficiency also decreased by 3 to 5 %. These values did not change even after the lamination.

(Comparative Example 2)

This comparative example is different from Example 1 in that a thin-film layer of $SiO_2$ was formed by the CVD method, instead of the thin-film resin layer.

The solar cell module was produced in the same manner as in Example 1 except for the above.

The same evaluations as in Example I were conducted and good results were obtained as to the initial characteristics.

However, the sufficient thickness was not obtained by evaporation of $SiO_2$ in the CVD method, and the film was found to be inadequate to function as an insulating protective film. The shunt resistance after the series connection decreased by 40 to 70 %. The conversion efficiency also decreased by 1 to 4 %. These values did not change even after the lamination.

Table 3 shows all evaluation results of Examples 1 to 3 and Comparative Examples 1 to 2 described above.

TABLE 3

|  | Before lamination | | | | After lamination | | | | Temp. cycle test |
|---|---|---|---|---|---|---|---|---|---|
|  | Initial Performance | | Series connection | | Appearance | | Performance | | |
|  | Shunt resistance | Conversion efficiency | Shunt resistance | Conversion resistance | Filling Property | Power-generating area/non-generating area | Shunt resistance | Conversion efficiency | |
| Ex. 1 | o | o | o | o | o | o | o | o | o |
| Ex. 2 | o | o | o | o | Δ | o | o | o | o |
| Ex. 3 | o | o | o | o | o | Δ | o | o | o |
| Comp. Ex. 1 | o | o | x | x | o | o | x | x | x |
| Comp. Ex. 2 | o | o | x | x | o | o | x | x | x |

The following points were clarified by the Examples and Comparative Examples.

(a) Since the photovoltaic device has the electrostatic withstand voltage of not less than 5 kV before the lamination, the semiconductor layer can be prevented from being damaged, even if a worker with charge touches the semiconductor layer of photovoltaic device to induce discharge.

(b) In the lamination step, the photovoltaic device can also be protected from the static electricity generated when the resin or/and the nonwoven fabric of glass fibers are shifted or rearranged on the photovoltaic device in order to achieve alignment between the photovoltaic device and the covering materials.

(c) During the series or parallel connection of photovoltaic devices, the photovoltaic devices can be protected from the mechanical or thermal impact such as dropping of tweezers onto the photovoltaic device or soldering.

(d) The series or parallel connection of at least two photovoltaic devices permits the lamination to be performed after they are combined in a large-area form of photovoltaic device. This improves the poor work efficacy due to a plurality of laminations of small-area photovoltaic devices. It also allows reduction in the percentage of the non-electric power-generating region with respect to tile area of installation.

(e) Since the thin-film resin layer is formed by the film coating method, the thin-film resin layer can be selectively formed in a part of the light-receiving surface side of the photovoltaic device.

(f) In the production method of the solar cell module obtained by sealing the photovoltaic device having the thin-film resin layer thereon with the resin, the amount of the resin necessary for filling the unevenness on the photovoltaic device can be decreased, because the photovoltaic device is placed on the support substrate with the light-receiving surface side facing up, thereafter the surface sealing material and surface member are successively stacked on the light-receiving surface side of the photovoltaic device, and

- 44 - then the lamination is carried out by heating in vacuum. This means that the resin's high combustibility is decreased, thus attaining a production method for a solar cell module excellent in flame resistance. The decrease in the amount of resin used also permits reduction of cost.

As described above, the present invention can provide the solar cell module and the production method thereof capable of protecting the semiconductor layer and maintaining high reliability, even if a charged worker or apparatus touches the photovoltaic device to induce discharge. As a result, the yield in production can be increased. In addition, the present invention can provide a solar cell module with high moisture resistance.

WHAT IS CLAIMED IS:

1. A photovoltaic device having an electrostatic withstand voltage of not less than 5 kV.

2. A photovoltaic device according to Claim 1, wherein a thin-film resin layer is provided on an electric power-generating region of a light-receiving surface side of said photovoltaic device.

3. A photovoltaic device according to Claim 2, wherein said thin-film resin layer comprises as a main component a resin selected from the group consisting of an acrylic resin, a silicone resin, and a fluororesin.

4. A photovoltaic device according to Claim 2, wherein said thin-film resin layer is a layer obtained by thermally crosslinking an acrylic resin and an inorganic polymer with a blocking isocyanate.

5. A photovoltaic device according to Claim 2, wherein a collector electrode is provided on the light-receiving surface side of said photovoltaic device and said thin-film resin layer in a top part of said collector electrode is thinner than in portions except for the top part, or absent.

6. A photovoltaic device according to Claim 2, wherein a collector electrode is provided on the light-receiving surface side of said photovoltaic device, said collector electrode is connected to a busbar, and said busbar is not covered by said thin-film resin layer.

7. A photovoltaic device according to Claim 2, wherein

8. A photovoltaic device according to Claim 2, wherein said thin-film resin layer is formed by a spray coater, a spin coater, a curtain coating, or a film coating.

9. A photovoltaic device array produced by electrically connecting a plurality of the photovoltaic devices as set forth in any one of Claims 1 to 8.

10. A solar cell module produced by sealing the photovoltaic device as set forth in any one of Claims 1 to 8 with a filler resin.

11. A solar cell module according to Claim 10, wherein a nonwoven fabric of glass fibers is contained in said filler resin.